(12) United States Patent
Kim et al.

(10) Patent No.: US 11,585,870 B2
(45) Date of Patent: Feb. 21, 2023

(54) ABSORPTION-BASED DIAMOND SPIN MICROSCOPY ON A PLASMONIC QUANTUM METASURFACE

(71) Applicant: Massachusetts Institute of Technology, Cambridge, MA (US)

(72) Inventors: Laura Kim, Belmont, MA (US); Hyeongrak Choi, Cambridge, MA (US); Matthew Edwin Trusheim, Cambridge, MA (US); Dirk Robert Englund, Brookline, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 17/376,234

(22) Filed: Jul. 15, 2021

(65) Prior Publication Data
US 2022/0082639 A1   Mar. 17, 2022

Related U.S. Application Data

(60) Provisional application No. 63/078,604, filed on Sep. 15, 2020.

(51) Int. Cl.
*G01R 33/032* (2006.01)
*G01R 29/08* (2006.01)

(52) U.S. Cl.
CPC ....... *G01R 33/032* (2013.01); *G01R 29/0885* (2013.01)

(58) Field of Classification Search
CPC .. G01R 33/032; G01R 29/0885; G01R 33/26; G01R 33/323

(Continued)

(56) References Cited

U.S. PATENT DOCUMENTS

5,581,499 A * 12/1996 Hamamdjian ......... G11B 13/00
                                                    365/244
5,619,139 A *  4/1997 Holczer ................ G01R 33/60
                                                    977/863

(Continued)

OTHER PUBLICATIONS

Patange, Om. On an instrument for the coherent investigation of nitrogen-vacancy centres in diamond. MS thesis. University of Waterloo, 2013. (Year: 2013).*

(Continued)

*Primary Examiner* — Christopher P McAndrew
(74) *Attorney, Agent, or Firm* — Smith Baluch LLP

(57) ABSTRACT

Nitrogen vacancy (NV) centers in diamond combine exceptional sensitivity with nanoscale spatial resolution by optically detected magnetic resonance (ODMR). Infrared (IR)-absorption-based readout of the NV singlet state transition can increase ODMR contrast and collection efficiency. Here, a resonant diamond metallodielectric metasurface amplifies IR absorption by concentrating the optical field near the diamond surface. This plasmonic quantum sensing metasurface (PQSM) supports plasmonic surface lattice resonances and balances field localization and sensing volume to optimize spin readout sensitivity. Combined electromagnetic and rate-equation modeling suggests a near-spin-projection-noise-limited sensitivity below 1 nT $Hz^{-1/2}$ per $\mu m^2$ of sensing area using numbers for contemporary NV diamond samples and fabrication techniques. The PQSM enables microscopic ODMR sensing with IR readout near the spin-projection-noise-limited sensitivity, making it appealing for imaging through scattering tissues and spatially resolved chemical NMR detection.

19 Claims, 14 Drawing Sheets

(58) Field of Classification Search
USPC .................................................. 324/244.1
See application file for complete search history.

(56) References Cited

U.S. PATENT DOCUMENTS

| | | | | |
|---|---|---|---|---|
| 9,910,104 | B2* | 3/2018 | Boesch | G01R 33/032 |
| 10,962,610 | B2 | 3/2021 | Ibrahim et al. | |
| 2003/0117141 | A1* | 6/2003 | Gerald, II | G01R 33/46 324/318 |
| 2004/0042525 | A1* | 3/2004 | Offerhaus | G02B 5/32 372/98 |
| 2008/0036462 | A1* | 2/2008 | Schiano | G01R 33/3671 324/318 |
| 2008/0198882 | A1* | 8/2008 | Clar | H01S 3/005 372/34 |
| 2010/0271016 | A1* | 10/2010 | Barclay | G01R 33/032 264/1.25 |
| 2014/0111154 | A1* | 4/2014 | Roy | H02J 50/50 320/108 |
| 2014/0252250 | A1* | 9/2014 | Botto | G01R 33/0041 250/564 |
| 2015/0090033 | A1* | 4/2015 | Budker | G01R 33/46 73/504.05 |
| 2015/0192532 | A1* | 7/2015 | Clevenson | G01N 24/006 324/304 |
| 2015/0253355 | A1* | 9/2015 | Grinolds | G01Q 70/14 850/40 |
| 2015/0378261 | A1* | 12/2015 | Englund | G03F 1/62 216/94 |
| 2016/0077167 | A1* | 3/2016 | Heidmann | G01Q 60/08 250/459.1 |
| 2016/0282427 | A1* | 9/2016 | Heidmann | G11B 5/012 |
| 2016/0313408 | A1* | 10/2016 | Hatano | G01R 33/032 |
| 2017/0146615 | A1* | 5/2017 | Wolf | G01N 21/6402 |
| 2017/0322244 | A1* | 11/2017 | Chipaux | G01R 23/163 |
| 2017/0370979 | A1* | 12/2017 | Braje | G01R 29/0885 |
| 2018/0203080 | A1* | 7/2018 | Acosta | G01N 24/08 |
| 2018/0252781 | A1* | 9/2018 | Meriles | G01N 24/12 |
| 2019/0235031 | A1 | 8/2019 | Ibrahim et al. | |
| 2019/0331674 | A1* | 10/2019 | Connolly | G01R 33/26 |
| 2019/0353975 | A1* | 11/2019 | Didomenico | G02B 3/14 |

OTHER PUBLICATIONS

Acosta et al., "Broadband magnetometry by infrared-absorption detection of nitrogen-vacancy ensembles in diamond." Applied Physics Letters 97.17 (2010): 174104. 3 pages.

Acosta et al., "Optical properties of the nitrogen-vacancy singlet levels in diamond." Physical Review B 82.20 (2010): 201202. 4 pages.

Aslam et al., "Nanoscale nuclear magnetic resonance with chemical resolution." Science 357.6346 (2017): 67-71.

Barnes et al., "Surface plasmon polaritons and their role in the enhanced transmission of light through periodic arrays of subwavelength holes in a metal film." Physical review letters 92.10 (2004): 107401. 4 pages.

Barry et al., "Sensitivity optimization for NV-diamond magnetometry." Reviews of Modern Physics 92.1 (2020): 015004. 68 pages.

Bougas et al., "On the possibility of miniature diamond-based magnetometers using waveguide geometries." Micromachines 9.6 (2018): 276. 11 pages.

Cappellaro et al., "Quantum correlation in disordered spin systems: Applications to magnetic sensing." Physical Review A 80.3 (2009): 032311. 7 pages.

Chatzidrosos, G. et al. Miniature Cavity-Enhanced Diamond Magnetometer. Phys. Rev. Applied 8, 044019 (2017). 5 pages.

Choi et al., "Quantum metrology based on strongly correlated matter." arXiv preprint arXiv:1801.00042 (2017). 11 pages.

Choy et al., "Spontaneous emission and collection efficiency enhancement of single emitters in diamond via plasmonic cavities and gratings," arXiv:1308.0522v1 [physics.optics] Aug. 2, 2013, 19 pages.

Dumeige et al., "Magnetometry with nitrogen-vacancy ensembles in diamond based on infrared absorption in a doubly resonant optical cavity." Physical Review B 87.15 (2013): 155202. 9 pages.

Foy et al., "Wide-field magnetic field and temperature imaging using nanoscale quantum sensors." ACS applied materials & interfaces 12.23 (2020): 26525-26533.

Gao et al., "Rayleigh anomaly-surface plasmon polariton resonances in palladium and gold subwavelength hole arrays." Optics Express 17.4 (2009): 2334-2340.

Jensen et al., "Cavity-enhanced room-temperature magnetometry using absorption by nitrogen-vacancy centers in diamond." Physical Review Letters 112.16 (2014): 160802. 5 pages.

Karamlou et al., "Metal-dielectric antennas for efficient photon collection from diamond color centers." Optics E0xpress 26.3 (2018): 3341-3352.

Kim et al., "Absorption-Based Diamond Spin Microscopy on a Plasmonic Quantum Metasurface," arXiv:2011.04885 (submitted on Nov. 10, 2020 (v1), last revised Nov. 21, 2020 (this version, v2)), 13 pages.

Meng et al., "Quantum spin liquid emerging in two-dimensional correlated Dirac fermions." Nature 464.7290 (2010): 847-851.

Nichol et al., "Nanoscale Fourier-transform magnetic resonance imaging." Physical Review X 3.3 (2013): 031016. 7 pages.

Perunicic et al., "A quantum spin-probe molecular microscope." Nature Communications 7.1 (2016): 1-10.

Robledo et al., "Spin dynamics in the optical cycle of single nitrogen-vacancy centres in diamond." New Journal of Physics 13.2 (2011): 025013. 12 pages.

Steele et al., "Metallodielectric gratings with subwavelength slots: Optical properties." Physical Review B 68.20 (2003): 205103. 7 pages.

Steinert et al., "Magnetic spin imaging under ambient conditions with sub-cellular resolution." Nature Communications 4.1 (2013): 1-6.

Takagi et al., "Concept and realization of Kitaev quantum spin liquids." Nature Reviews Physics 1.4 (2019): 264-280.

Tetienne et al., "Magnetic-field-dependent photodynamics of single NV defects in diamond: an application to qualitative all-optical magnetic imaging." New Journal of Physics 14.10 (2012): 103033. 16 pages.

Trusheim et al., "Wide-field strain imaging with preferentially aligned nitrogen-vacancy centers in polycrystalline diamond." New Journal of Physics 18.12 (2016): 123023. 8 pages.

Turner et al., "Magnetic Field Fingerprinting of Integrated Circuit Activity with a Quantum Diamond Microscope." arXiv preprint arXiv:2004.03707 (2020). 12 pages.

Ulbricht et al., "Excited-state lifetime of the N V—infrared transition in diamond." Physical Review B 98.9 (2018): 094309. 4 pages.

Wee et al., "Two-photon excited fluorescence of nitrogen-vacancy centers in proton-irradiated type 1b diamond." The Journal of Physical Chemistry A 111.38 (2007): 9379-9386.

\* cited by examiner

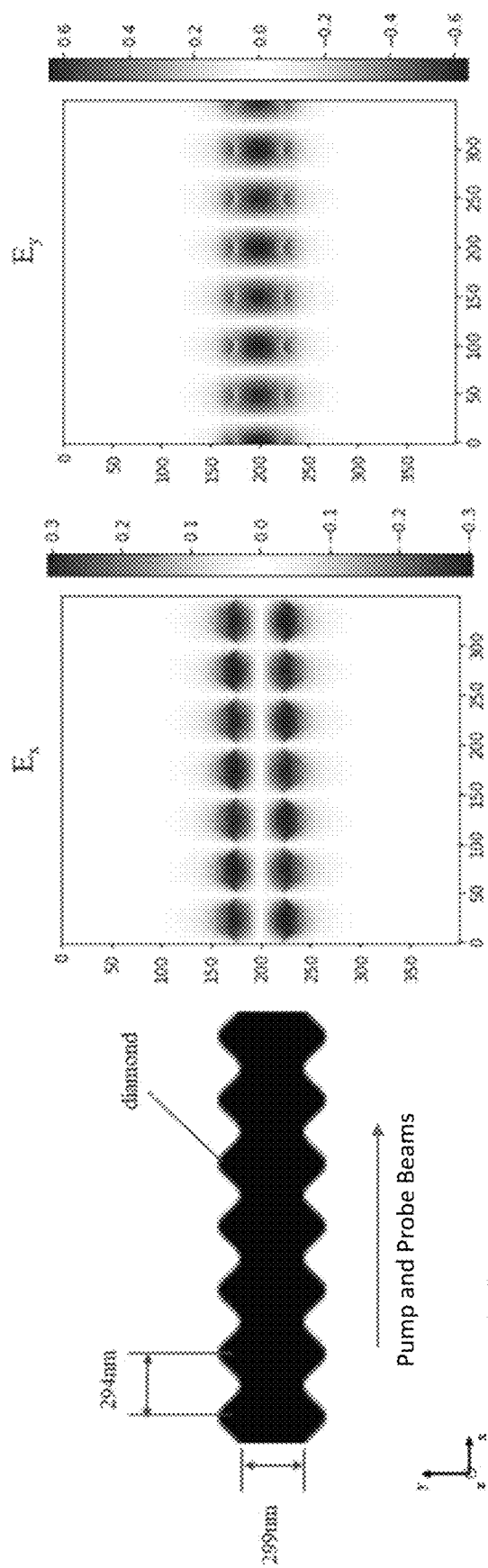
FIG. 4C
FIG. 4B
FIG. 4A
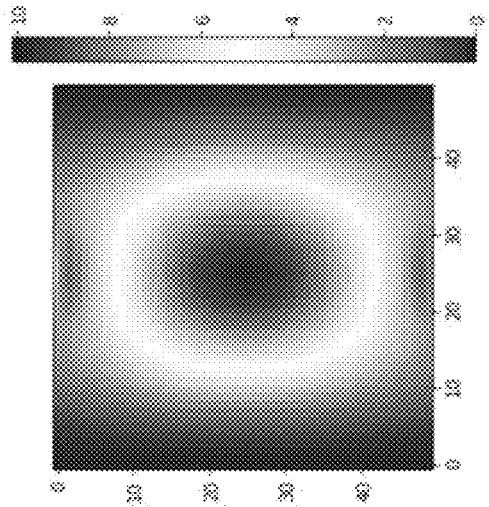
FIG. 4D
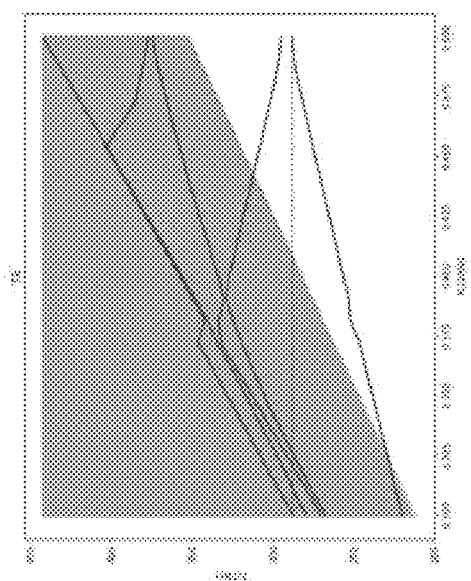
FIG. 4E

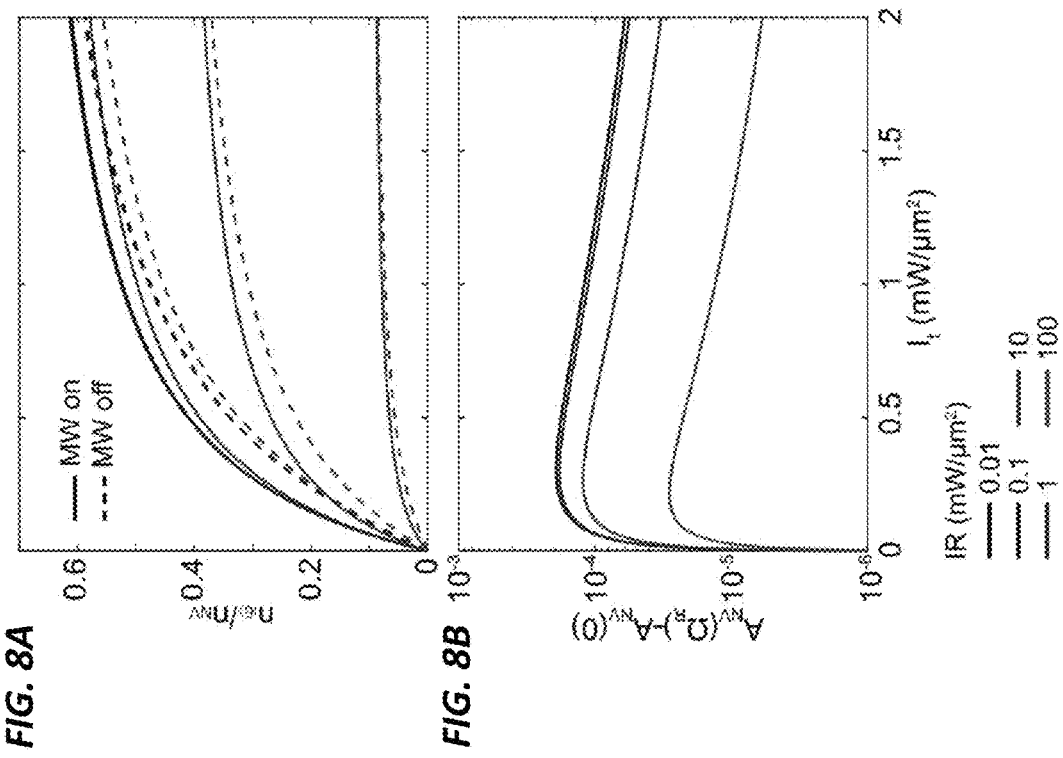
FIG. 8A
FIG. 8B
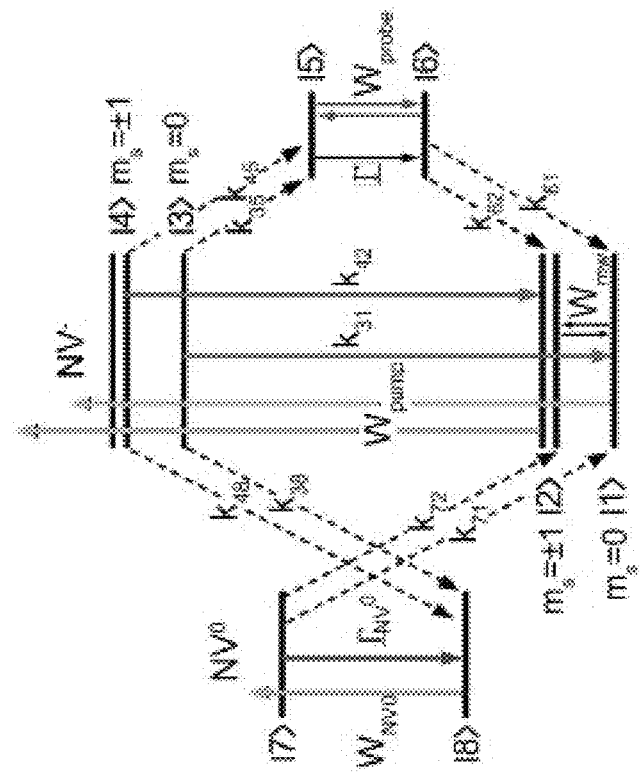
FIG. 7

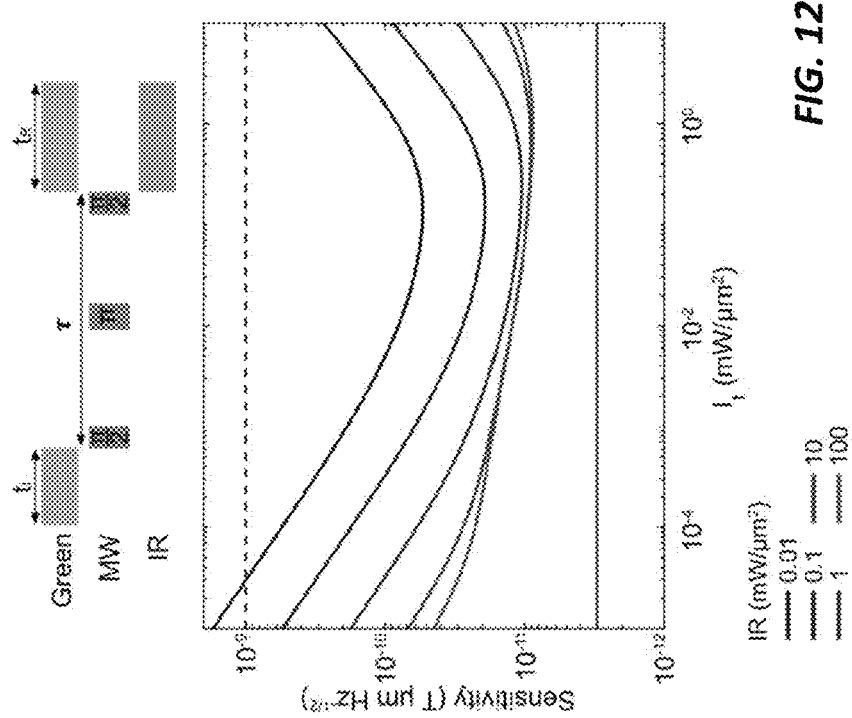
FIG. 12
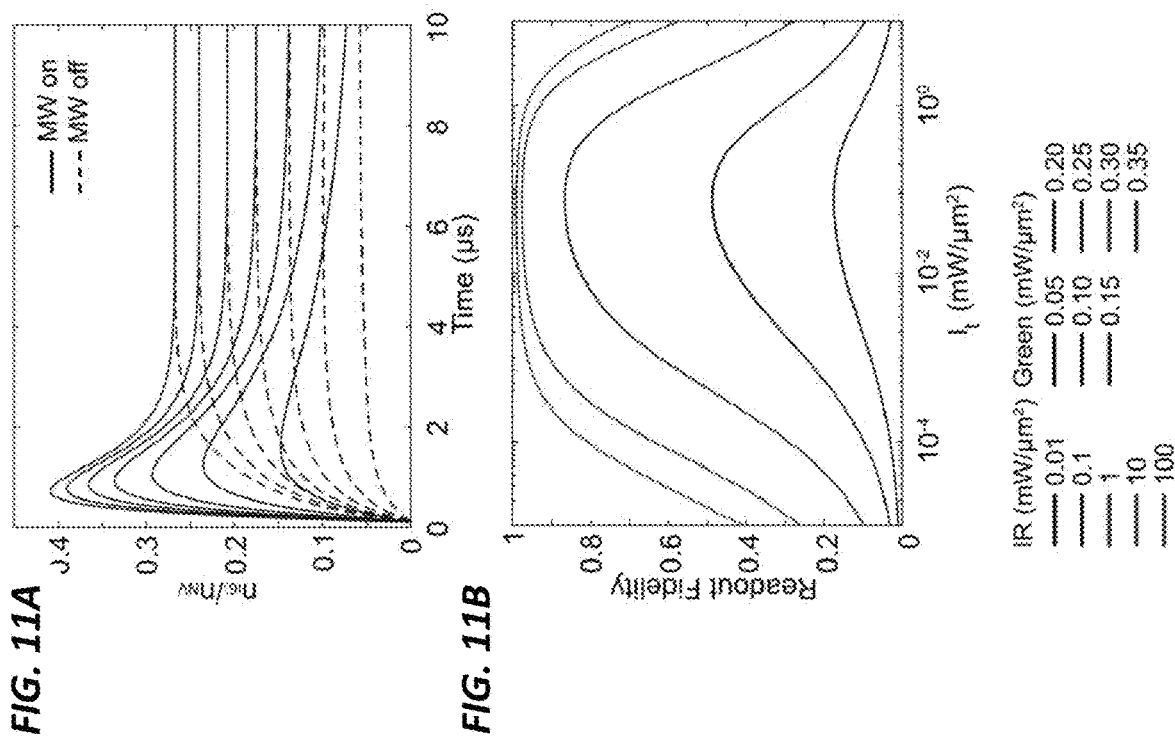
FIG. 11A
FIG. 11B

ABSORPTION-BASED DIAMOND SPIN MICROSCOPY ON A PLASMONIC QUANTUM METASURFACE

CROSS-REFERENCE TO RELATED APPLICATION(S)

This application claims the priority benefit, under 35 U.S.C. 119(e), of U.S. Application No. 63/078,604, which was filed on Sep. 15, 2020, and is incorporated herein by reference in its entirety.

GOVERNMENT SUPPORT

This invention was made with Government support under Grant No. W911NF-17-1-0435 and W911NF-19-2-0186 awarded by the Army Research Office, and under Grant No. D18AC00014 awarded by the Defense Advanced Research Projects Agency (DARPA). The Government has certain rights in this invention.

BACKGROUND

The ability to optically measure quantities such as electric field, magnetic field, temperature, and strain under ambient conditions makes nitrogen vacancy (NV) centers in diamond appealing for a range of wide-field sensing applications, from imaging biological systems and electrical activity in integrated circuits to studying quantum magnetism and superconductivity in quantum materials. NV-based magnetometers have shown exceptional sensitivity at room temperature, but conventional fluorescence-based readout methods result in sensitivity values far from the spin projection noise limit primarily due to background fluorescence, poor photon collection efficiency, and low spin-state contrast. These limitations can be overcome by probing the infrared singlet transition near 1042 nm by absorption. However, this absorption-based readout has only been demonstrated for bulk diamond samples with a large optical path length of millimeters to centimeters due to the small absorption cross section of the singlet state transition. This long-pathlength requirement presents the central challenge in infrared (IR) readout to imaging microscopy, where the sensing depth should commonly be below the micron-scale.

SUMMARY

A periodic structure, such as a plasmonic quantum sensing metasurface (PQSM), enhances IR absorption in NVs by confining vertically incident IR probe light in a micron-thick NV layer in a diamond host with a quality factor of about 100 to about 9000 (e.g., 100, 300, 400, 1000, 2000, 3000, 4000, 5000, 6000, 7000, 8000, or 9000). In one embodiment, the PQSM includes a metallodielectric grating that couples plasmonic surface lattice excitations with Bragg modes caused by the Rayleigh-Wood anomaly (RWA). The periodic arrangement of the plasmonic resonators embedded in or disposed on a diamond host concentrates the local field within the NV layer and provides wavelength-scale field enhancement. Unlike fluorescence, which is emitted isotropically, the directional reflection (or transmission) of a probe beam by the NVs can be captured with near-unity efficiency. In particular, detection of the reflected coherent probe light with a standard camera enables shot-noise limited detection, eliminating the need for single-photon detectors. Taken together, a PQSM or other periodic structure coupled to an NV sensing layer can enable a sensitivity below 1 nT Hz$^{-1/2}$ per $\mu m^2$ of sensing area.

An absorption-based diamond spin microscopy system may include a solid-state host (e.g., diamond) with a sensing layer containing spin defect centers (e.g., NVs), an infrared (IR) light source, a periodic structure, and a detector. The spin defect centers have absorption resonances that change in response to an electric field, a magnetic field, a temperature, a stress, and/or a strain. In operation, the IR light source illuminates the spin defect centers with an IR optical field (e.g., at a wavelength of 1042 nm). The periodic structure, which is disposed on or embedded in the sensing layer, enhances the IR optical field in the sensing layer. And the detector, which is in optical communication with the solid-state host via the periodic structure, senses absorption of the IR optical field by at least some of the spin defect centers.

The periodic structure can have a quality factor of about 100 to about 10,000. It can include a metallodielectric grating with a period or grating pitch equal to a wavelength of the IR optical field divided by a refractive index of the solid-state host. Running a current through this metallodielectric grating applies a bias magnetic field to the layer of spin defect centers.

The absorption by the spin defect centers can vary in response to the magnetic field, in which case the system can detect variations in the magnetic field with a sensitivity of below nT/Hz$^{1/2}$ per $\mu m^2$. The detector may sense the absorption of the IR optical field by measuring a portion of the IR probe beam diffracted from the periodic structure at a Bragg angle of the periodic structure. For example, the detector may perform homodyne measurement of the portion of the IR probe beam diffracted from the periodic structure.

The system may also include a pump light source, in optical communication with the solid-state host, that illuminates the spin defect centers in the layer of spin defect centers with a (visible) pump beam. This pump beam excites the spin defect centers to an excited state. In this case, the periodic structure can be patterned to concentrate the pump beam in the sensing layer.

A system for sensing a magnetic field may include a solid-state host, spin defect centers disposed within one millimeter of a surface of the solid-state host, an IR light source, a metallodielectric grating embedded in the surface of the solid-state host, and a detector. The spin defect centers have absorption resonances that shift in response to the magnetic field. The IR illuminates the spin defect centers with IR optical radiation. The metallodielectric grating, which has a period based on a wavelength of the IR optical radiation and a refractive index of the solid-state host at the wavelength of the IR optical radiation, applies a bias magnetic field to the spin defect centers. It also enhances absorption of the IR optical radiation by the spin defect centers. And the detector, which is in optical communication with the spin defect centers via the metallodielectric grating, senses the absorption of the optical radiation by the spin defect centers.

The metallodielectric grating can support a hybrid plasmonic surface lattice resonance-Rayleigh-Wood anomaly mode that concentrates the infrared optical radiation within one millimeter of the surface of the solid-state host. The metallodielectric grating can have a quality factor of 100 to 1000. And the detector can acquire a phase-sensitive homodyne image of the spin defect centers.

All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., elements that are functionally and/or structurally similar).

FIG. 1A illustrates absorption-based diamond spin microscopy on a plasmonic quantum sensing metasurface (PQSM) made of a metallodielectric grating. TM-polarized incoming light excites a plasmonic SLR mode, creating a vertically extended field profile as shown in the overlapping $Re(E_y)$. Upon an applied microwave magnetic field with a Rabi frequency of $\Psi_R$, the NV spin response incurs an additional phase change, $\Delta\phi_{NV}$. The spin-dependent signal, $|E_{sig}|^2$, is separated from the un-diffracted beam, $|E_{ud}|^2$, in a dark-field excitation geometry and interferes with a local oscillator, $|E_{LO}|^2$. The interfered output beam, $I_{out}$, is detected by a CCD camera.

FIG. 1B is a plot of the total electric field intensity profile at $\lambda_s=1042$ nm with p=426.5 nm, w=277 nm, t=55 nm, and $\theta_i=1°$. The arrow plot shows the magnetic field, $\vec{B}$, inducted by a uniform driving current in an array of plasmonic silver wires. The length of arrows is proportional to the magnetic field strength. The structure is assumed to be infinitely periodic in x-direction.

FIGS. 4A-4E illustrate an alligator-type slow-light waveguide sensing structure and its performance.

FIG. 7 is an energy-level diagram for neutral and negatively charged nitrogen NV centers in diamond.

FIG. 8A is a plot of the population of the ground singlet state as a function of $I_t$ with (solid) and without (dotted) an applied microwave field.

FIG. 8B is a plot of differences in NV absorption, $A_{NV}$, as a function of $I_t$ with and without an applied microwave (MW) field excitation.

Figure 10:
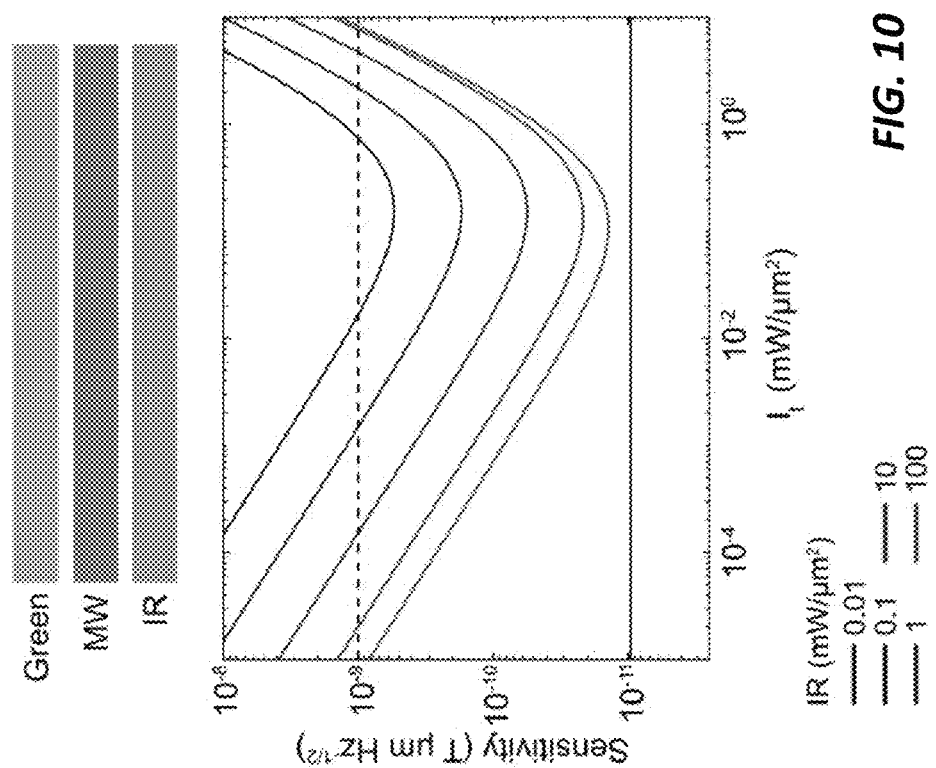

FIG. 10 is a plot of area-normalized sensitivity as a function of $I_t$ with varying $I_s$. The dotted black line indicates 1 nT $Hz^{-1/2}$ sensitivity for a one-square-micrometer sensing area. The solid black line indicates the spin-projection-noise-limited sensitivity.

FIG. 11A is a plot of the population of the ground singlet state with (solid line) and without (dotted) an applied microwave field as a function of readout time for a given $I_s=1$ mW/m².

FIG. 11B is a plot of readout fidelity as a function of $I_t$.

FIG. 12 is a plot of AC sensitivity per root sensing surface area as a function of $I_t$ with varying $I_s$. The solid black line represents the spin-projection-noise-limited sensitivity.

Figure 13:
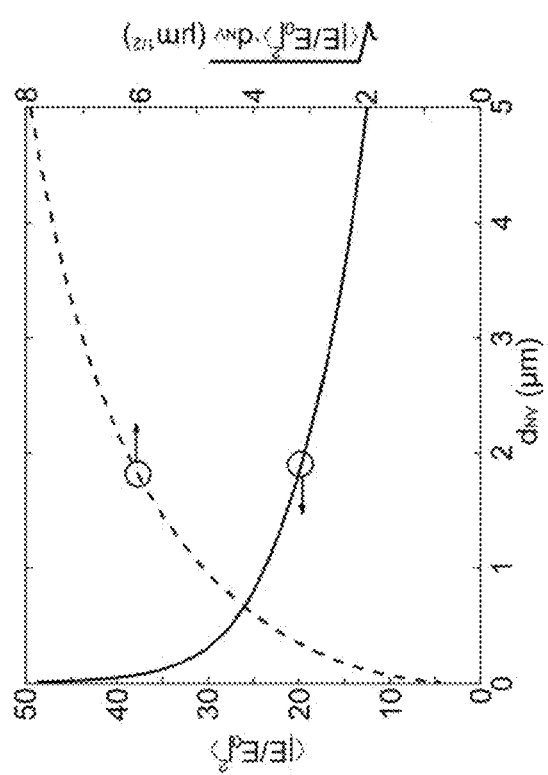

FIG. 13 is a plot of spatially averaged electric field intensity, $\langle |E/E_0|^2 \rangle$ (left), for a given $d_{NV}=1$ µm at $\lambda_s=1042$ nm and the figure of merit, $\sqrt{\langle |E/E_0|^2 \rangle d_{NV}}$ (right), of the PQSM at $\lambda_s=1042$ nm.

Figure 14:
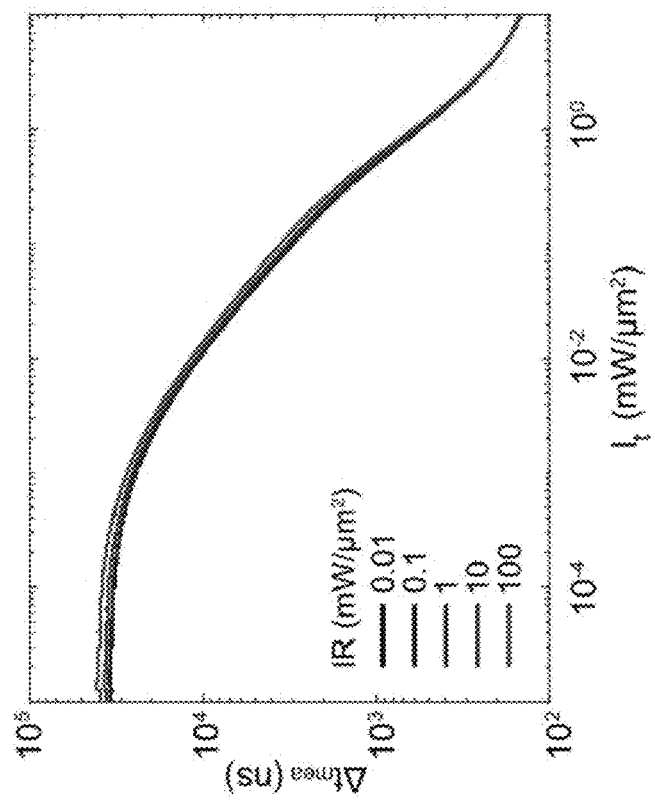

FIG. 14 is a plot of optimal readout time for pulsed measurements.

Figure 15:
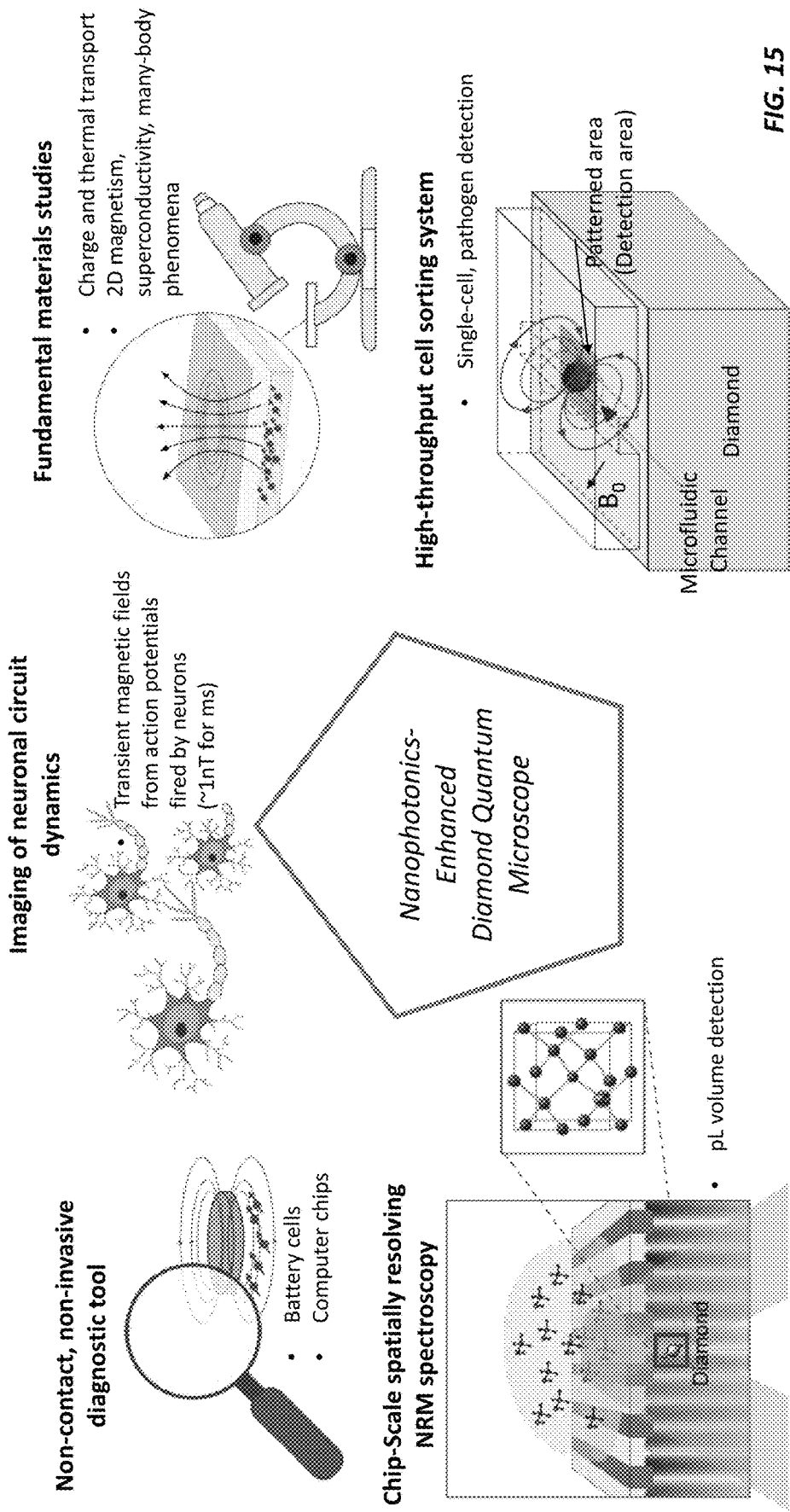

FIG. 15 illustrates different applications for absorption-based diamond spin microscopy with enhanced sensitivity from periodic structures.

DETAILED DESCRIPTION

A diamond quantum sensing surface with a periodic structure, such as an array of plasmonic nanostructures, can sense magnetic fields with a sub-nT $Hz^{-1/2}$ per square micron of sensing surface. With an array of plasmonic nanostructures, also called a plasmonic quantum sensing metasurface (PQSM), this exceptional performance is achieved by a hybrid surface plasmon lattice excitation-Rayleigh-Wood anomaly (RWA) resonance that concentrates or enhances the electric field within a micron-scale layer of spin defect centers. The plasmonic structures of this PQSM can also provide microwave control: if the plasmonic structures are conductive (e.g., if they include metal wires), running a current through them generates a homogeneous magnetic field across a large sensing area. Combined with a homodyne detection, the PQSM makes a new type of quantum microscope that enables high-speed imaging measurements at the photon shot noise limit.

Periodic structures made of lossless materials are particularly advantageous as they can mitigate substantial Ohmic losses and subsequent heating effects encountered in plasmonic metamaterials. A dielectric periodic structure can alleviate issues encountered by spin defect centers near metallic materials (e.g., tunneling, quenching for fluorescence-based method, and NV charge state fluctuations). The optical field enhancement created by the periodic structure defines the layer of spin defect centers that measure the magnetic field, electric field, temperature, strain, stress, or other parameter. Also, the large field intensity enhancement enables the use of more stable spin defect centers that are embedded in the solid-state host far from the surface (near-surface spin defect centers tend to have shorter coherence time due to surface charges, etc.). Despite the increased source-to-sensor stand-off distance due to the periodic structure, the resonant field intensity enhancement is large enough that the sensitivity can be as good as or better than that of the near-surface spin defect centers.

By using periodic structures made of phase changing/tunable dielectric materials, such as GST or GSST, the enhancement of the resonant optical field maybe be tuned. Heating and/or cooling these materials, e.g., with intense pulses of infrared light or with integrated heaters, causes them to undergo phase changes that increase or decrease their refractive indices. Tuning the refractive index of the periodic structures varies the depth of the field enhancement, e.g., from tens of nanometers to several microns. It can also switch the field enhancement on or off if the effective refractive index of the periodic structure can be tuned to match the refractive index of the solid-state host or a surrounding cap layer.

FIG. 15 shows different applications of absorption-based diamond spin microscopy with periodic structures for field enhancement. These applications include microfluidic channel integration (e.g., for measuring analytes flowing over the periodic structure/host surface), cytometer-analogue, cell sorting systems (lower right), and quantum science. Metasurface-coupled arrays of spin defect centers (also called color centers, quantum sensors, or quantum emitters) can enable manipulation of accumulated phase and polarization at each position of a spin defect center. By superposing spin-dependent reflection or transmission, it may be possible to entangle different regions of the metasurface. An entangled quantum metasurface is useful in applications that demand measurements of correlated quantum fluctuation such as quantum spin liquids in quantum materials. Such an approach can exploit entanglement-enhanced quantum sensing protocols to achieve performance beyond the standard quantum limit.

Other applications include measuring the secondary magnetic field of eddy currents induced in conductive materials, such as batteries or computer chips, under an applied primary magnetic field. Amplitude and phase changes in the measured secondary magnetic field can provide information about cracks/flaws in the materials or on-going activities of computer chips. The large sensitivity improvement provided by the periodic structure 110 may enable non-destructive sensing/measurement of encapsulated devices (i.e., can tolerate stand-off distances). And for small quantities of chemicals, the sensor can perform spatially resolving chemical shift NMR measurements, with the periodic structure replacing the large coil used in conventional NMR spectroscopy.

IR-Absorption-Based Magnetic Field Detection with a Quantum Sensing System

Figure 1A:
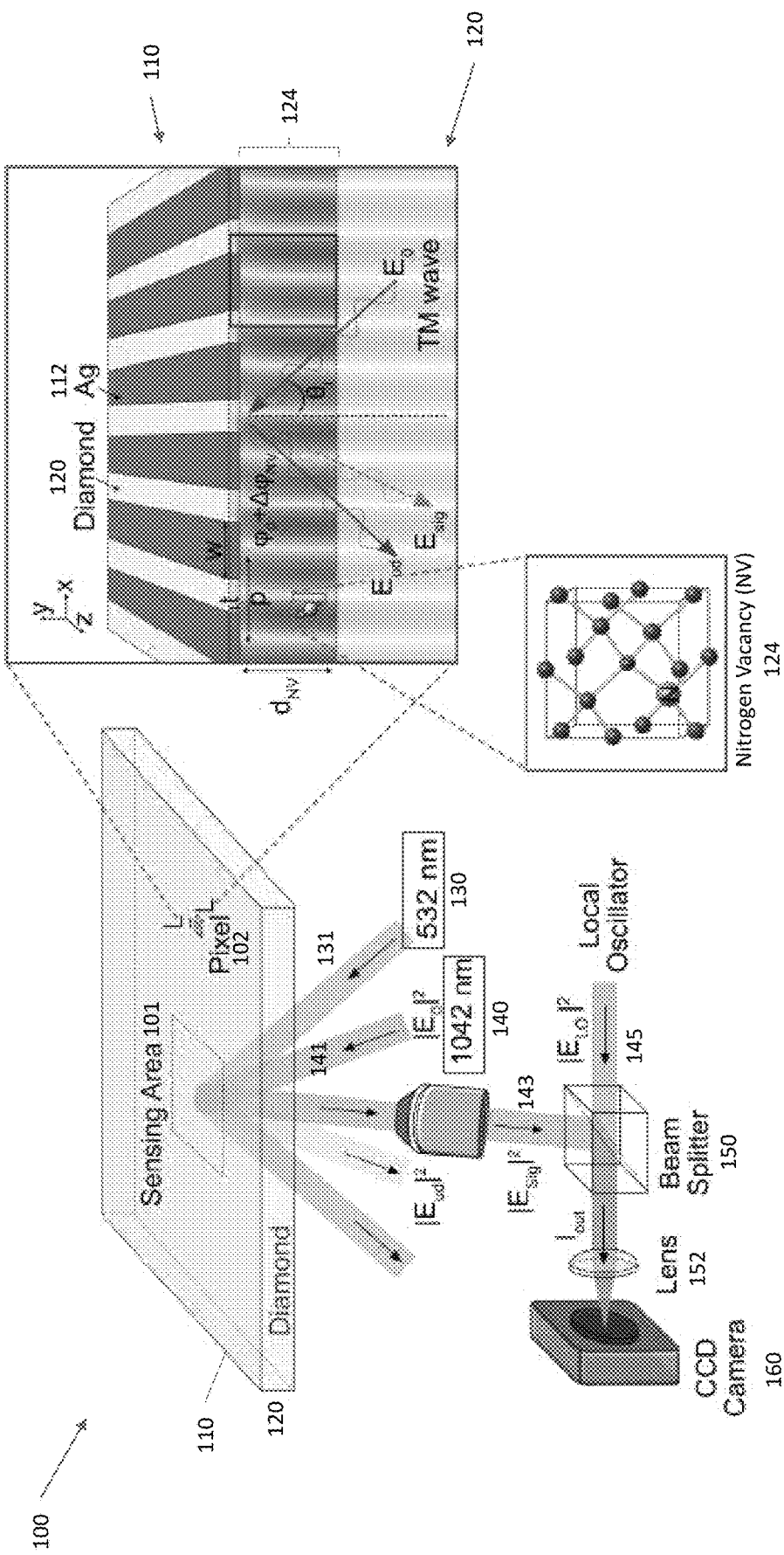

FIG. 1A shows a quantum sensing system 100 with a periodic structure 110 in or on a solid-state host 120 doped with spin defect centers 124. Varying the magnetic field, electric field, temperature, stress, or strain applied to the spin defect centers 124 changes the absorption of IR light by the spin defect centers 124. These parameters can be varied by placing a sample, such as minerals or biological tissue (e.g., neurons or other cells), on or near a sensing area 101 on the surface of the solid-state host 120 with the periodic structure 110. For example, the sample may include cells that flow over the sensing area 101 and are sorted based on the measurements made by the quantum sensing system 100. Other suitable samples include 2D conductive or magnetic materials, picolitre-scale quantities of chemicals, and samples with conductive materials, such as batteries or computer chips.

In this example, the spin defect centers 124 are NVs in a diamond host 120. Other suitable spin defect centers include group IV emitters, such as silicon vacancies (SiV), germanium vacancies (GeV), tin vacancies (SnV), and lead vacancies (PbV). The density of the spin defect centers 124 in the solid-state host 120 can vary from 1 ppb to 100 ppm, depending on the desired sensitivity, which scales as the square root of the number of spin defect centers 124, and coherence time, which decreases at higher densities.

The inset of FIG. 1A shows the periodic structure 110 in greater detail. The periodic structure 110 can be formed on the diamond 120 or at least partially embedded in the diamond 120. It is a resonant metasurface whose resonance matches the optical transitions of the spin defect centers 124 and has a quality factor of about 100 to about 9000 (e.g., 200, 300, 400, 500, 600, and so on). In operation, it confines the infrared optical field that probes the spin defect centers 124 within a sensing layer 122 at the top of the diamond 120. There is a tradeoff between the confinement and the quality factor: confining the infrared optical field more tightly (e.g., in a plasmonic-like mode with sub-wavelength confinement) near the periodic structure 110 reduces the quality factor but improves the sensitivity for a thinner sensing layer 122. A higher quality factor generally correlates with weaker or reduced field confinement, which can be beneficial for a thicker sensing layer 122.

The periodic structure 110 in FIG. 1A is a PQSM that comprises a metallodielectric grating formed of silver wires 112 that are embedded in (or deposited on) the surface of the diamond 120. The grating period, or pitch of the silver wires 112, equals the wavelength of the infrared light used to probe the spin defect centers divided by the refractive index of the solid-state host 120. For a probe wavelength of 1042 nm and a diamond host, the grating period is about p=426.5 nm. The silver wires 112 have widths and thicknesses that are significantly smaller than the probe wavelength, e.g., w=273 nm, and t=55 nm. Other periodic structures 110 can be made entirely of dielectric materials, including a-Si (n=3.6392 at 1042 nm), GaAs (n=3.4192), GST (n=2.6), amorphous GSST (n=3.64, k=0.079), or crystalline GSST (n=5.3, k=1.1). The thickness of the periodic structure can range from 10 nm to 500 nm, with thinner periodic structures providing shorter distances between the samples and the spin defect centers. The width of each ruling (silver wire) can vary from about one-tenth of the grating period (42.65 nm for a diamond host) to about nine-tenths of the grating period (383.85 nm for a diamond host).

The PQSM 110 enhances or concentrates the field sensed by the quantum sensing system 100 in a sensing layer 122 of the diamond 120. This sensing layer 122 has a thickness that can range from tens of nanometers to a few millimeters (e.g., 10 nm, 100 nm, 1 μm, 10 μm, 100 μm, 1 mm, 10 mm, or any value between any of these values). It is directly below the PQSM 110. Put differently, the PQSM 110 is formed directly on or at a surface of the diamond 120, and the sensing layer 122 extends a depth, $d_{NV}$, from that surface into the diamond 120. The PQSM 110 could also be fabricated in or on a diamond membrane that is on the sample, which in turn is on a diamond slab. In some cases, the sensing layer 122 can extend through the entire thickness of the diamond 120 (i.e., the diamond 120 may be very thin). The diamond 120 can also be thicker than the sensing layer 122 as shown in FIG. 1A.

Figure 1B:
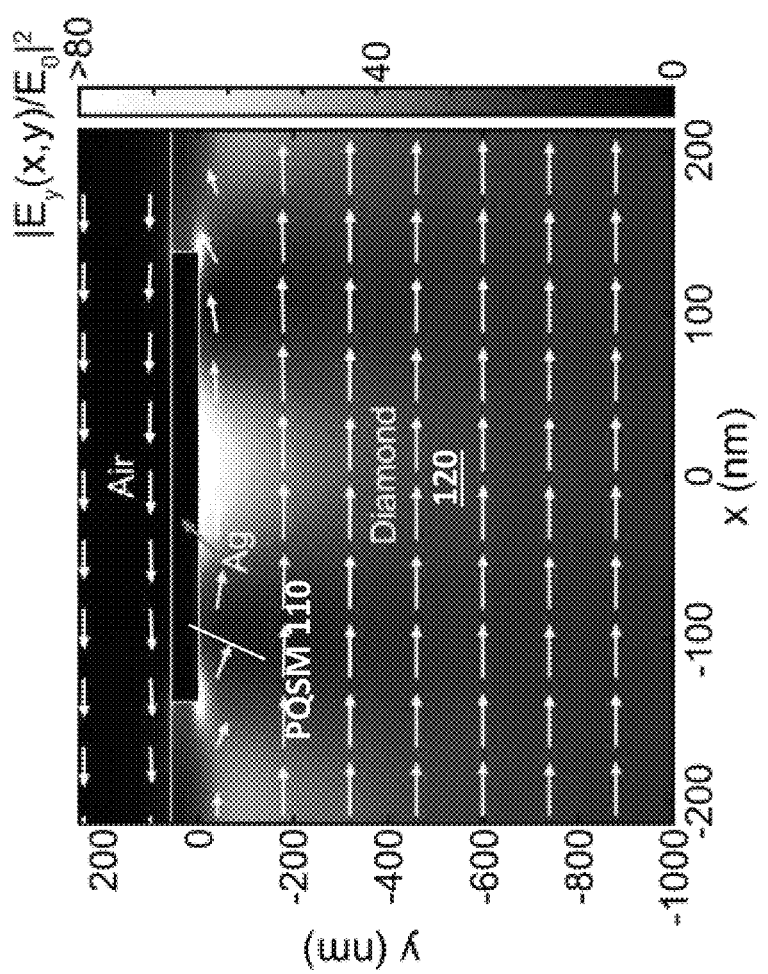

The silver wires 112 in the PQSM 110 can double as a wire array for NV microwave control: with a subwavelength spacing, running a current through the array of silver wires 112 produces a homogeneous transverse magnetic field, $\vec{B}$, as shown in FIG. 1B. Local excitation and probing of NVs 124 within a pixel 102 are possible by varying the current running through individual wires 112. It is also possible to create a magnetic field gradient using the wires 112 to address emitters within the pixels 102.

The quantum sensing system 100 also includes a pump laser 130 that illuminates the spin-defect centers 124 within a sensing area 101 of the sensing layer 122 with a pump beam 131 at a wavelength $\lambda_t$=532 nm and an intensity of $I_t$ for NV spin initialization. This pump beam 131 hits the back side of the PQSM 110 through the diamond 120 but could also illuminate the diamond 120 from the side(s) or through the PQSM 110.

A probe laser 140 illuminates the spin-defect centers 124 in the sensing area 101 of the sensing layer 122 with a transverse magnetic (TM) polarized probe beam 141 a wavelength $\lambda_s$=1042 nm and an intensity of $I_s$ for IR readout. This probe beam 141 illuminates the spin defect centers 124 in the sensing layer 122 via the back side of the PQSM 110 and diamond 120 at an angle $\theta_i$ but could shine through the PQSM 110 in addition or instead. The PQSM 110 localizes and intensifies the infrared optical field provided by the probe beam 141 near the surface of the diamond 120 (i.e., the surface with the PQSM 110) as shown in FIG. 1B. The localized, intensified infrared optical field overlaps the sensing layer 122, enhancing absorption of the probe beam 141 by the spin defect centers 124 in the sensing layer 122.

(The periodic structure 110 can also be patterned to confine or concentrate the pump beam 131 in the sensing layer 122. If the surface normal is in the z direction, for example, the periodic structure 110 can have a period or pitch in the x direction equal to the pump beam wavelength divided by the refractive index of solid-state host 120 at the pump beam wavelength and a period or pitch in the y direction equal to the probe beam wavelength divided by the refractive index of solid-state host 120 at the probe beam wavelength. In this example, the pump beam 131 illuminates the sensing area 101 at an angle in the x-z plane, and the probe beam 141 illuminates the sensing area 101 at an angle in the y-z plane. The periodic structure 110 could also be patterned in a more sophisticated fashion, for example, as a two-dimensional photonic crystal, that is resonant at both the pump and probe beam wavelengths.)

The PQSM-NV signal, which varies with the external magnetic field experienced by the spin defect centers 124, is manifested as spin-dependent phase and amplitude changes in the reflection 143 of the probe beam 141 by the spin defect centers 124 in the sensing layer 122. The reflected beam 143 is diffracted at the Bragg angle from the periodic structure 110 (in FIG. 1A, the reflected beam 143 is the −1 order). This angular separation between the probe beam 141 and the reflected/diffracted beam 143 allows the signal field, $E_{sig}$, to be separated from the undiffracted field, $E_{ud}$, in a dark-field excitation geometry (i.e., k-vector filtering).

Unlike in fluorescence measurements, in this absorption-based measurement scheme, the spatially well-defined signal beam 143 ensures a near-unity collection efficiency. The collected signal beam 143 is interfered with a local oscillator beam 145 having an amplitude $E_{LO}$ using a beam splitter 150. (The local oscillator beam 145 can be generated be the same laser 140 that generates the probe beam 141.) A lens 152 focusing the interfering signal beam 143 and local oscillator beam 145 onto a detector array, such as a CCD camera 160, which performs a phase-sensitive homodyne measurement. The interfered light intensity, $I_{out}$, detected by the CCD camera 60 is given by:

$$\frac{I_{out}(I_t, \Omega_R, R, \Delta\phi_{LO})}{I_s} = (1-R) + R\left|r(I_t, \Omega_R)\right|^2 + 2\sqrt{(1-R)R}\,|r(I_t, \Omega_R)|\cos(\Delta\phi_{LO} + \Delta\phi_{NV}(I_t, \Omega_R)),$$

where R is the power splitting ratio of the beam splitter, $r(I_t, \Omega_R)$ is the complex reflection coefficient of the PQSM, and $\Delta\phi_{LO}$ is the relative phase difference between $E_{LO}$ and $E_{sig}$ when $I_t$=0. A combination of R and $\Delta\phi_{LO}$ is chosen to maximize the signal-to-noise (SNR).

FIG. 1A shows that the pump beam 131 and the probe beam 141 illuminate the sensing layer 122 in a confocal geometry. They can also be scanned across the sensing layer 122 using tilting mirrors or other beam-scanning devices to vary the location of the sensing area 101. For example, the pump beam 131 and the probe beam 141 can be scanned in a continuous raster pattern or turned on and off as they are deflected to different portions of the sensing layer 122. Alternatively, the pump beam 131 and the probe beam 141 can illuminate some or all of the sensing layer 122 in a wide-field geometry. Or the pump laser 130 and probe laser 140 can be replaced with arrays of pump and probe lasers, each of which illuminates a different pixel 102. These pixels 102 can be defined by etching the diamond 120 so that air gaps or channels separate neighboring pixels 102, confining the infrared optical field laterally in addition to the vertical confinement from the periodic structure 110. The pixels 102 can be tuned individually using microwave excitation as described below.

Alternative Periodic Structures

Figure 2B:
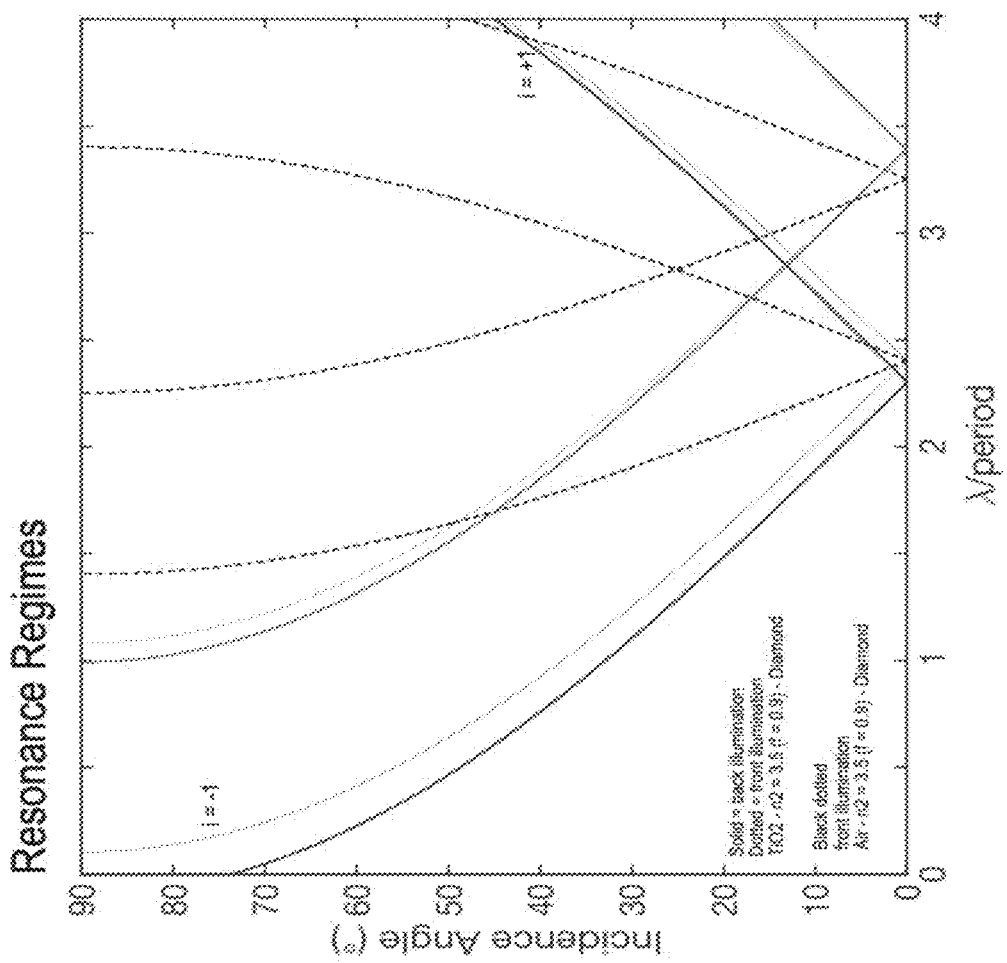
FIG. 2B is a plot of resonance regimes in the device of FIG. 2A.
Figure 2A:
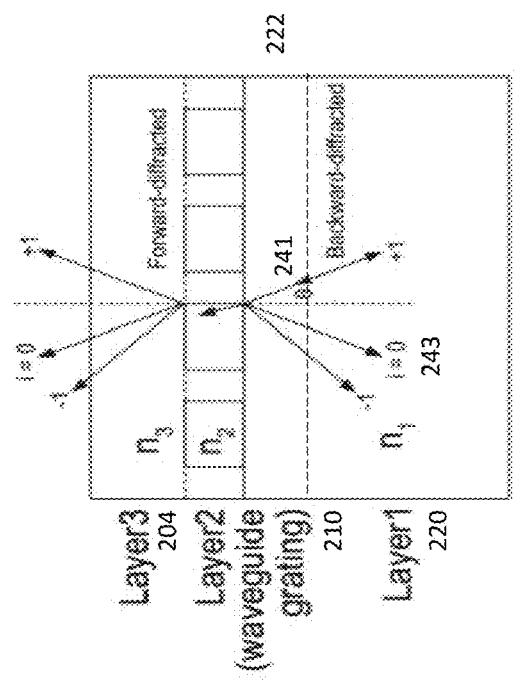
FIG. 2A shows a dielectric periodic structure that concentrates an incident IR probe field in a layer of a solid-state host doped with spin defect centers.

FIGS. 2A and 2B show an alternative periodic structure 210 for enhancing absorption of an infrared optical field by spin defect centers in a thin layer of a solid-state host 220. This periodic structure 210 is formed of an array of rulings made of a high-index dielectric material, such as amorphous silicon (a-Si), gallium arsenide (GaAs), or a phase-change material, deposited on the surface of the solid-state host 220 and is covered with a lower-index dielectric layer 204 whose refractive index closely matches the refractive index of the underlying diamond, such as titanium dioxide ($TiO_2$). The pitch or period of the periodic structure 210 is equal to the wavelength of an IR probe beam 241 divided by the refractive index of the solid-state host 220 (e.g., 426.5 nm for a 1042 nm probe beam and a diamond host).

The periodic structure 210 and layer 204 in FIG. 2A supports a guided mode resonance (GMR). A GMR structure can be understood as a high-index grating waveguide. At resonance, the incident IR probe wave 241 can couple to the guided mode via a grating structure (i.e., the periodic structure 210), and the "leaked" waves from the waveguide interfere with the incident IR probe wave 241 to produce a sharp, high-quality-factor resonance peak. This structure is particularly advantageous as an imaging surface as it can readily couple with external radiation while the energy is confined in the grating waveguide slab with a significant field overlap with a thin layer 222 of the diamond 220. The interference phase can be tuned to engineer background reflection/transmission signal.

FIG. 2B is a plot of the incidence angle of the IR probe beam versus the ratio of the IR probe beam wavelength to the grating period. The solid lines represent back illumination (i.e., through the solid-state host 220) and the dotted lines represent front illumination (i.e., through the low-index layer 204).

Figures 3A, 3B:
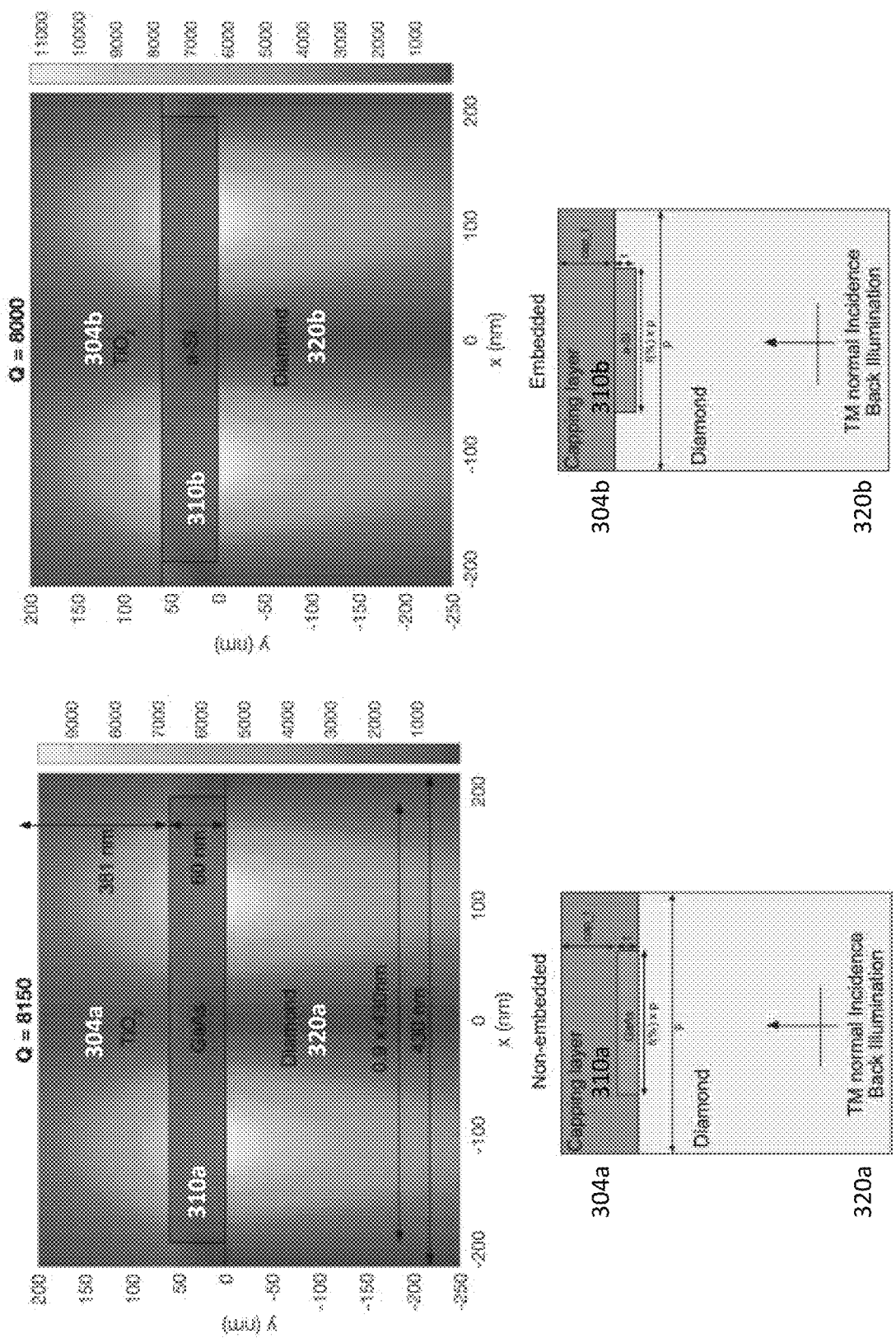
FIG. 3A illustrates infrared optical field confinement in a diamond sensing layer by a GaAs periodic structure disposed on a surface of the diamond sensing layer, capped with a $TiO_2$ layer.
FIG. 3B illustrates infrared optical field confinement in a diamond sensing layer by an a-Si periodic structure embedded in the diamond sensing layer, capped with a $TiO_2$ layer.

FIGS. 3A and 3B illustrate differences between a periodic dielectric structure 310a that is embedded in a solid-state host 320a and a periodic dielectric structure 310b that is deposited on the solid-state host 320b. The lower portion of each figure shows a single period of the corresponding periodic structure, and the upper portion of each figure shows the (enhanced) infrared optical field as a function of position with that period. In FIG. 3A, a 60 nm thick GaAs periodic structure 310a is disposed on the surface of a diamond host 320a and capped with a 200 nm thick $TiO_2$ layer 304a. In FIG. 3B, a roughly 50 nm thick a-Si periodic structure 310b is embedded in a diamond host 320b and capped with a 200 nm thick $TiO_2$ layer 304b. Each diamond is doped with NVs.

The embedded periodic structure 310a provides a better field overlap with the diamond 320a as well as a larger field intensity enhancement. The capping layer 304a, 304b should be thick enough to ensure a maximum field intensity enhancement factor near $10^4$ (the quality factors of periodic structures 310a and 310b are 8150 and 8000, respectively). At the same time, the capping layers 304a, 304b should be thin enough for the analyte to produce a measurable change in the magnetic field sensed by the NV centers in the diamond 320a, 320b. TM probe fields penetrate deeper into the diamond layer, which is more suitable for sensing. The quality factor and the spatially averaged field intensity increase with fill factor. The average refractive index, $n_g$, of each periodic structure can be modulated or engineered with other materials selections.

Generally, a larger field overlap with the diamond sensing layer ensures a higher sensitivity. However, the high quality factor of the GMR mode relies on a large array of periodic structures, and as a result, the resulting spatial resolution is coarser than that can be achieved with cavities. This issue can be circumvented by, for example, placing a mirror on the phase acquired by the wave travelling the distance between two mirrors is m×2π; in this case, a set of mirrors is making the structure effectively an infinite array. Even one period is sufficient to maintain the quality factor and field intensity enhancement obtained assuming an infinitely periodic array. The transverse dimension of each pixel of the proposed imaging surface can be at the nanoscale. Other approaches are to spatially resolve the magnetic field changes by (1) sweeping the incidence angle of the excitation (pump beam), e.g., using resonance splitting with off-normal incidence, or (2) periodicity modulation within a pixel.

Slow Light Waveguide Sensing Structures

FIGS. 4A-4E and 5A-5D show diamond waveguides slow down the speed of light by a factor of roughly 20, thus increasing the interaction time between NVs in the diamond waveguides and pump and probe photons. They can be used to sense magnetic fields with analytes or samples placed on or under their slab surfaces.

FIGS. 4A-4E illustrate an alligator-type slow-light waveguide sensing structure and its performance. FIG. 4A shows a top view of the sensing structure. It includes a diamond slab waveguide with periodically corrugated sides that slow the propagation of pump and probe beams through the diamond slab by a factor of 25.98 to 26. This slowing enhances the infrared optical field via the Purcell effect by a Purcell factor of about 15. The sample to be measured can be placed on top of the waveguide.

Figure 5B:
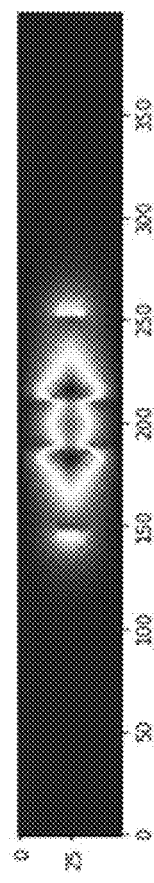
FIGS. 5A-5D illustrate an alternative slow-light waveguide sensing structure and its performance.
Figure 5C:
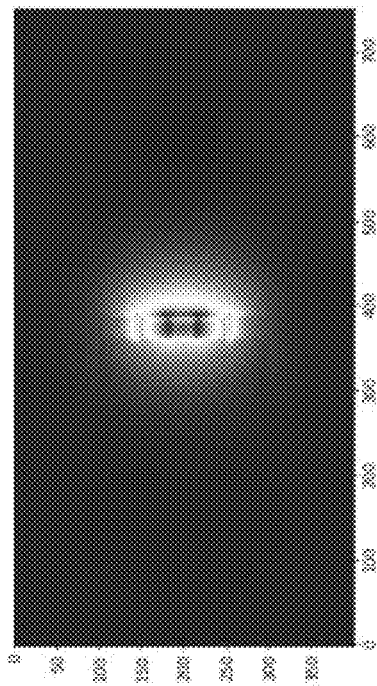
Figure 5A:
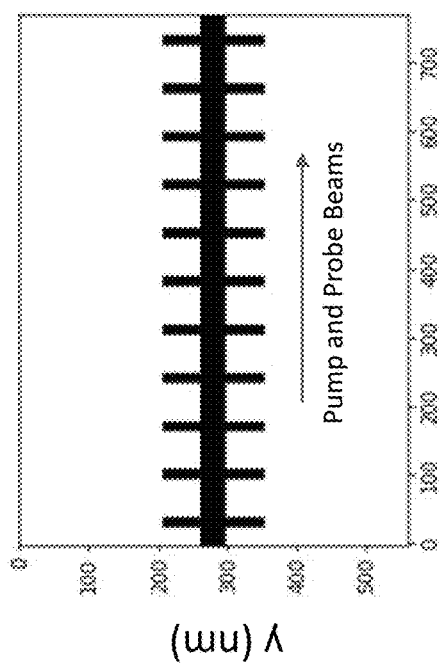
Figure 5D:
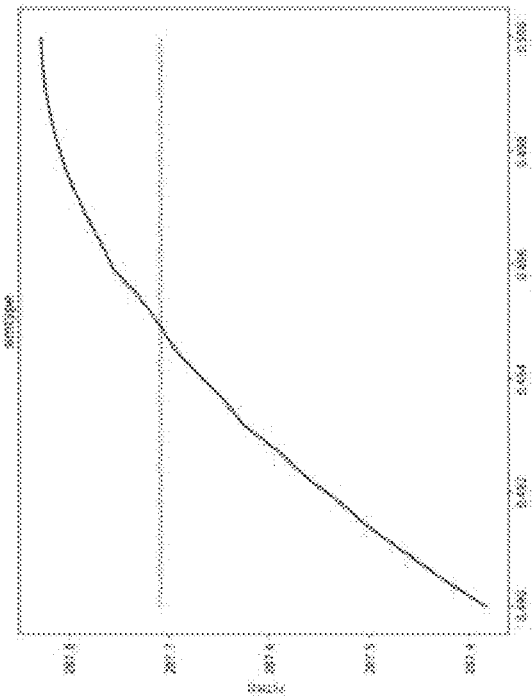

FIGS. 5A-5D illustrate an alternative slow-light waveguide sensing structure and its performance. FIG. 5A shows a top view of the sensing structure. It includes a diamond slab waveguide with periodically spikes or extension that slow the propagation of pump and probe beams through the diamond slab by a factor of about 21.1. This slowing enhances the infrared optical field via the Purcell effect by a Purcell factor of about 8.95. The sample to be measured can be placed on top of the waveguide.

Periodic Structure Design

The resonant metasurface structure should increase or maximize the IR signal of the spin ensemble sensors (the NVs or other spin defect centers). Other implementations of IR absorption readout use bulk diamond samples with long optical path lengths because the intrinsic absorption cross sectional area of an NV is about an order of magnitude smaller than that of the triplet state transition for an NV. The resonant metasurface structure enhances this weak light-matter interaction by modifying the local electromagnetic environment of quantum emitters as follows.

The rate of absorption of a quantum emitter under an oscillating electromagnetic field with frequency, $\omega_s$, can be expressed following Fermi's golden rule.

$$\Gamma_{abs} = \frac{2}{\hbar}|\langle 5|\vec{\mu}\cdot\vec{E}|6\rangle|^2 \rho(\omega_s), \quad (1)$$

where $\vec{\mu}=e\cdot\vec{r}$ is the transition dipole moment operator, $\vec{E}$ is the electric fields, and $\rho(w)=(1/\pi\hbar)\{(\gamma^*/2)/[(\omega-\omega_s)^2+(\gamma^*/2)^2]\}$ is the electronic density of states, which is modeled as a continuum of final states with a Lorentzian distribution centered at $\omega_s$ with linewidth $\gamma^*$. For a given angle, β, between the emitter's transition dipole orientation, $\vec{\mu}$, and the electric field, $\vec{E}$, created by a resonant metasurface structure, Eq. (1) can be expressed in terms of the spontaneous emission rate of the singlet state transition, $\gamma=(\omega_0^3|\langle 5|\vec{\mu}|6\rangle|^2)/(3\pi\epsilon\hbar c^3)$:

$$\Gamma_{abs} = \frac{3}{\pi^2\hbar}\frac{\gamma}{\gamma^*}\left(\frac{\lambda_s}{\sqrt{\epsilon}}\right)^3 \cdot \frac{1}{2}\epsilon_0\epsilon|\vec{E}|^2\cos^2(\beta),$$

where ε is the relative permittivity of the diamond or other solid-state host. The equation suggests that the rate of transition enhancement originates from the electric field intensity enhancement at the position of a spin defect center, color center, or other quantum sensor, assuming the properties of the spin defect center remain unperturbed. Contributions of all four orientations of NV emitters are averaged to determine the signal of the PQSM containing an ensemble of emitters.

To guide resonant metasurface structure optimization, consider a figure of merit (FOM) maximizing the spin-dependent absorption signal for a given sensing volume of $V_{pixel}=L^2\times d_{NV}$, where $L^2$ is the area of a pixel and $d_{NV}$ is the thickness of the sensing layer with a uniform spin-density defect center density of $n_{NV}$. In the shot noise limit, the signal-to-noise ratio (SNR) of the pixelated plasmonic imaging surface is given by:

$$SNR = \frac{|N_0 - N_1|}{\sqrt{N_0 + N_1}}$$

$$= \sqrt{\frac{\Delta t_{mea} L^2}{\hbar \omega_0}} \frac{I(0) - I(\Omega_R)}{\sqrt{I(0) + I(\Omega_R)}},$$

where $N_0$ and $N_1$ are the average numbers of photons detected from the $m_s=0$ and $m_s=\pm 1$ states, respectively, of the spin defect center per measurement, $\Delta t_{mea}$ is the total readout time, and $I(0/\Omega_R)=I_{out}(I_p,0/\Omega_R,R,\Delta\phi_{LO})$. Here, $|r(I_p,\Omega_R)|$ is defined as $|\alpha_0 - \alpha_{NV}(I_p,\Omega_R)|$, where $|\alpha_0|^2$ is the intrinsic reflection of the PQSM and $|\alpha_{NV}(I_p,\Omega_R)|^2 = A_{NV}$ is the NV absorption. For $|\alpha_0|^2 \gg |\alpha_{NV}(I_p,\Omega_R)|^2$, the SNR scales with $|\alpha_{NV}(I_p,\Omega_R)| - |\alpha_{NV}(I_p,0)|$; equivalently, it scales with the FOM, $\sqrt{\langle |E/E_0|^2 \rangle V_{pixel} n_{NV}}$, where $\langle |E/E_0|^2 \rangle = \int_{pixel} |E/E_0|^2 dV / \int_{pixel} dV$ is the spatially averaged optical field enhancement over $E_0$, which is the single-pass field without the resonant metasurface structure. The detailed derivation for this FOM is given below.

Localized surface plasmon (LSP) resonances can focus light intensity at subwavelength scales and have been used to increase spontaneous emission rates of single emitters or ensembles of emitters confined in a nanometer-scale volume. However, this field concentration comes with the trade-off of reducing the number of NV centers, $N_{NV}$, that are coupled to the optical field. In addition, concentrating an electromagnetic field near a metallic material leads to losses due to Ohmic damping and dephasing.

The PQSM 110 in FIG. 1A delocalizes the infrared optical field while maintaining a large electric field intensity and mitigates losses via coupling LSP resonances to the diffractive states of the RWA. Balancing this trade-off depends on the use case: sensing applications with a spatial resolution finer than the grating period benefit from highly localized LSP-like modes, while applications with a coarser lateral resolution benefit from more RWA-like modes that average over a larger $N_{NV}$. The field intensity profile shown in FIG. 1B is the result of an optimization with the FOM being the electric field intensity spatially averaged over a given sensing (NV) layer thickness of 1 μm under a plane-wave excitation. The PQSM 110 is modeled as a periodic arrangement of plasmonic structures embedded in the solid-state host (e.g., silver wires or other metallic material with negative permittivity at the pump and probe wavelengths in diamond forming a metallodielectric grating) that satisfies the dispersion relation given by:

$$\frac{\omega_s}{c} n = |k_x + mG|, \quad (2)$$

where c is the speed of light in vacuum, n is the refractive index of diamond, $k_x = k_0 \sin(\theta_i)$ is the momentum component of free-space light in the direction of grating period, m denotes the diffraction order, and $|G|$ is given by $2\pi/p$. Eq. (2) indicates that an incoming far-field radiation with momentum, $k_0$, gains momentum by integer multiples of $|G|$ and can satisfy momentum matching conditions to couple with the grating mode. When the Bragg scattering condition is met, the incident electromagnetic wave diffracts parallel to the PQSM surface and creates a field profile that extends away from the PQSM surface, providing a sufficient field overlap with the sensing (NV) layer.

Metal-Diamond Metallodielectric Periodic Structures

The large field concentration near the PQSM surface occurs when the RWA is coupled with a periodic array of plasmonic structures that support a so-called surface lattice resonance (SLR). The RWA mode alone is independent of the material properties of the embedded nanostructure (Eq. (2)). However, as the mode shown in FIG. 1B has a plasmonic nature, it is highly dependent on the permittivity of the metallic material. Replacing the silver wires in the PQSM with perfect electric conductors, which support no plasmonic resonance as no field penetration is possible to excite collective oscillations of free carriers (plasmons), reduces the field intensity dramatically as explained in greater detail below. The SLR mode of the PQSM has a quality factor near 300. The PQSM combines a large field enhancement of the LSP mode and delocalization of the Bragg mode, making the SLR mode well-suited for magnetic field sensing by ensembles of spin defect centers.

Figures 6A, 6B:
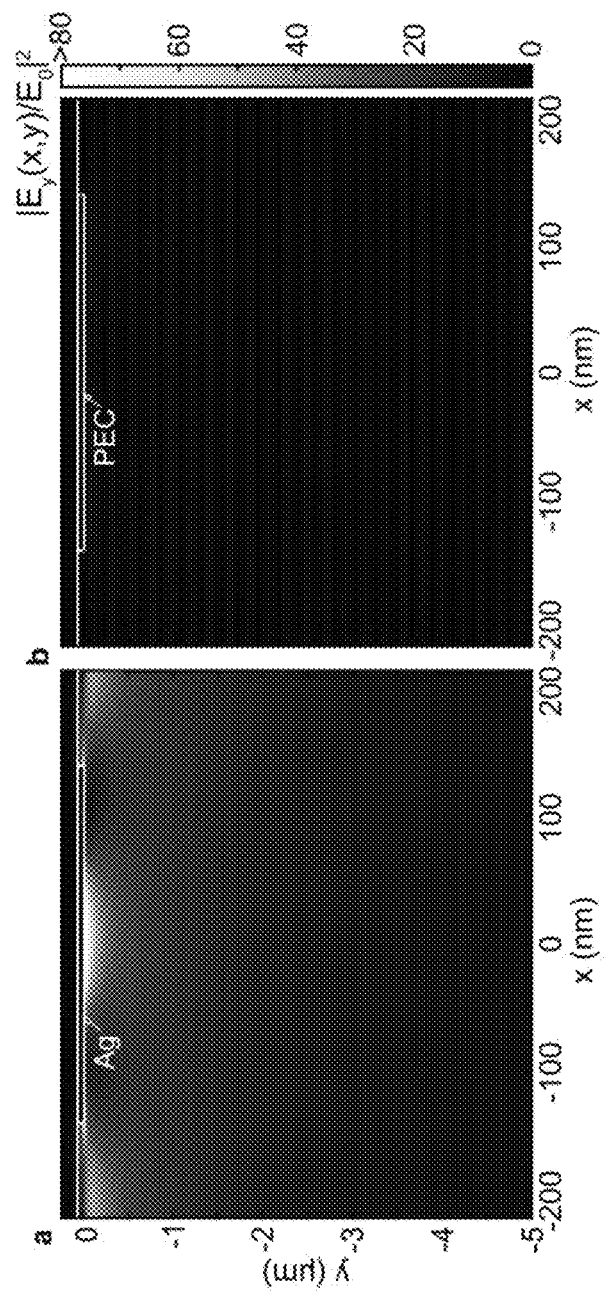
FIG. 6A shows the total electric field intensity profile for a PQSM made of embedded silver wires under TM-polarized back-side illumination at $\lambda_s=1042$ nm with $\theta_i=1°$.
FIG. 6B shows the total electric field intensity profile for a PQSM made of embedded perfect electrical conductors under TM-polarized back-side illumination at $\lambda_s=1042$ nm with $\theta_i=1°$.

FIG. 6A shows the electric field intensity profile of the PQSM with silver wires as in FIG. 1A. The corresponding plasmonic SLR exhibits a quality factor of near 300. FIG. 6B shows the electric field intensity profile for a PQSM in which silver is replaced with a perfect electric conductor (PEC). The dimensions of the silver and PEC structures are p=426.5 nm, w=273 nm, and t=55 nm. PEC structures cannot support surface plasmon polaritons (SPPs) as field penetration is prohibited, causing a dramatic reduction in the electric field intensity.

Figure 6D:
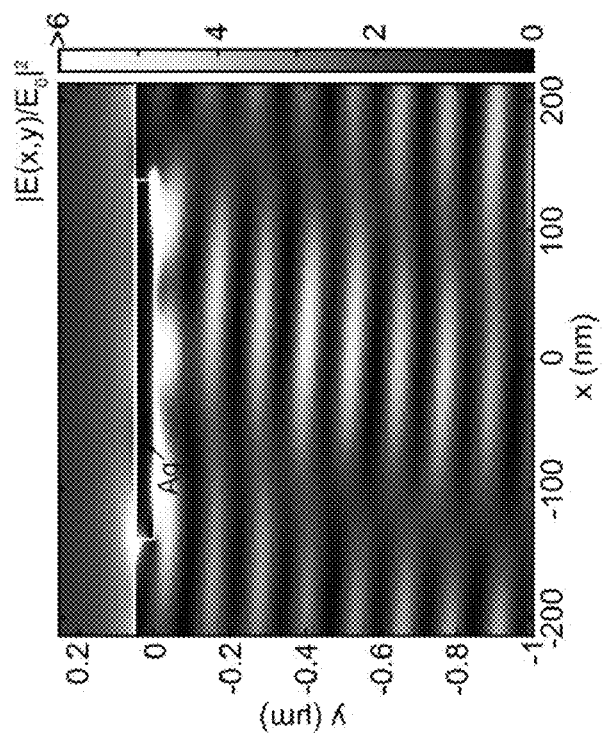
FIG. 6D is a plot of the total electric field intensity profile under TM-polarized illumination at $\lambda_s=532$ nm from the backside with an off-normal incidence of $\theta_i=24.6°$.
Figure 6C:
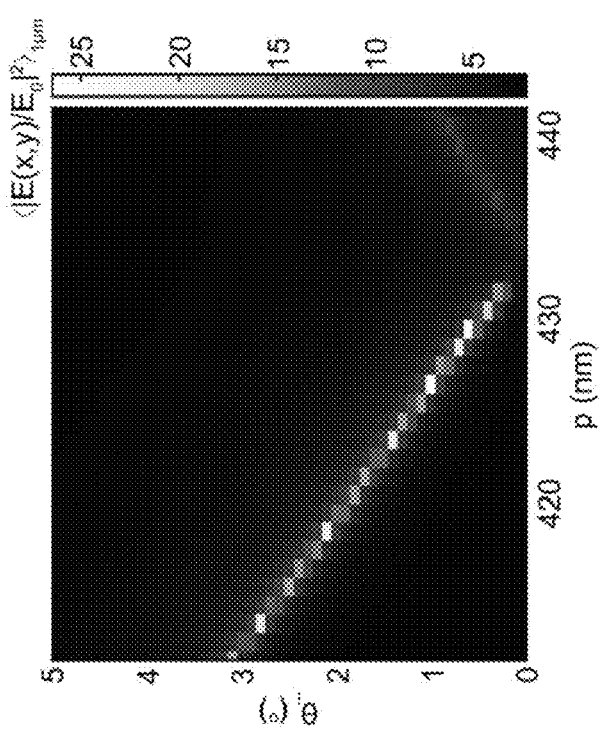
FIG. 6C is a plot of the electric field intensity spatially averaged over $d_{NV}=1$ µm as a function of period, p, and incidence angle, $\theta_i$, for a given t=50 nm and $\lambda_s=1042$ nm.

FIG. 6C shows how the spatially averaged optical field enhancement depends on the period, p, of the PQSM and incidence angle, $\theta_i$, of the probe beam. The deviation in period can be compensated with a change in incidence angle to achieve resonance at $\lambda_s=1042$ nm. Furthermore, the plasmonic SLR depends sensitively on the array size. Air trenches into the diamond or Bragg mirrors, for example, can confine a pixel to a few microns in size by preventing the optical energy from leaking to the side and maintain the quality factor of the infinitely periodic array.

Without changing the geometric parameters of the PQSM, it is possible to couple in the green laser excitation for populating the singlet state by inducing a grating resonance at 532 nm via an off-normal incidence (i.e., compensating for the momentum mismatch, $k_x$). FIG. 6D shows the electric field intensity profile under TM-polarized plane wave excitation, and the corresponding spatially averaged electric field intensity over the first 1-m-thick NV layer, $\langle |E/E_0|^2 \rangle$, is approximately 2. Alternatively, an array supporting a plasmonic SLR at $\lambda_t=532$ nm can be made orthogonal to the existing array and achieve a larger reduction in green laser power consumption with polarization-dependent excitation.

Spin-Dependent Response

FIG. 7 shows an eight-level energy structure that accounts for the photodynamics of an NV, including Zeeman energy shifts that are caused by external magnetic fields and that can be polarized and measured optically. This energy structure includes the spin sublevels of an NV spin defect center. The spin sublevels $m_s=0$ and $m_s=\pm 1$ of the $^3A_2$ ground triplet state, labelled as $|1\rangle$ and $|2\rangle$, respectively, are separated by a zero-field splitting of D=2.87 GHz. This transition can be accessed with a resonant microwave field (shown as $W_{MW}$ in FIG. 6). Illuminating the NV with spin-conserving, off-resonant green laser light ($W_{pump}$ in FIG. 6) causes a fraction of the population to decay non-radiatively into the $^1A_1$ metastable singlet state, $|5\rangle$, predominantly from $|4\rangle$ as $k_{45} \gg k_{35}$, where $k_{ij}$ indicates the decay rate from level i to level j. After a sub-nanosecond decay from $|5\rangle$ to $|6\rangle$, the shelving time at $|6\rangle$ exceeds 200 ns at room temperature. The population of $|6\rangle$ can be measured by absorption of the singlet state transition resonant at 1042 nm ($W_{probe}$ in FIG. 6).

The local density of each sublevel, $n_{|i\rangle}$, can be calculated based on the following coupled rate equations under the assumption of spin-conserving optical transitions and a number conservation constraint (i.e., $\Sigma_i n_{|i\rangle} = n_{NV}$, where $n_{NV}$ is the total NV density):

$$\frac{dn_{|1\rangle}}{dt} = -(W_{pump} + W_{MW})n_{|1\rangle} + W_{MW}n_{|2\rangle} + k_{31}n_{|3\rangle} + k_{61}n_{|6\rangle} + k_{71}n_{|7\rangle}$$

$$\frac{dn_{|2\rangle}}{dt} = W_{MW}n_{|1\rangle} - (W_{pump} + W_{MW})n_{|2\rangle} + k_{42}n_{|4\rangle} + k_{62}n_{|6\rangle} + k_{72}n_{|7\rangle}$$

$$\frac{dn_{|3\rangle}}{dt} = W_{pump}n_{|1\rangle} - (k_{31} + k_{35} + k_{38})n_{|3\rangle}$$

$$\frac{dn_{|4\rangle}}{dt} = W_{pump}n_{|2\rangle} - (k_{42} + k_{45} + k_{48})n_{|4\rangle}$$

$$\frac{dn_{|5\rangle}}{dt} = k_{35}n_{|3\rangle} + k_{45}n_{|4\rangle} - (\gamma_{nr} + F_p\gamma_r + \gamma_{quenching} + W_{probe})n_{|5\rangle} + W_{probe}n_{|6\rangle}$$

$$\frac{dn_{|6\rangle}}{dt} = (\gamma_{nr} + F_p\gamma_r + \gamma_{quenching} + W_{probe})n_{|5\rangle} - (W_{probe} + k_{61} + k_{62})n_{|6\rangle}$$

$$\frac{dn_{|7\rangle}}{dt} = -(\Gamma_{NV^0} + k_{72} + k_{71})n_{|7\rangle} + W_{NV^0}n_{|8\rangle}$$

$$\frac{dn_{|8\rangle}}{dt} = k_{38}n_{|3\rangle} + k_{48}n_{|4\rangle} + \Gamma_{NV^0}n_{|7\rangle} - W_{NV^0}n_{|8\rangle}$$

Here, $k_{ij}$ is the transition rate constant from state $|i\rangle$ to state $|j\rangle$. $\Gamma_{NV^0}$ is the decay rate from $|7\rangle$ to $|8\rangle$, and $\Gamma = \gamma_{nr} + F_p\gamma_r + \gamma_{quenching}$ is the decay rate from $|5\rangle$ to $|6\rangle$, where $F_p$ is the Purcell factor, $\gamma_{quenching}$ is the quenching rate, and $\gamma_{nr}$ and $\gamma_r$ are the non-radiative and radiative decay rates of state $|5\rangle$, respectively. $W_{pump/probe}$ is the optical excitation rate of the triplet/singlet transition given by $\sigma_{t/s} I_{t/s} / \hbar \omega_{t/s}$, where $\sigma$ is the absorption cross sectional area, I is the laser intensity, and $\omega$ is the angular frequency of the corresponding transition. The resonant metasurface structure enhances the optical excitation rates $W_{pump/probe}$ by a factor of $\langle |E/E_0|^2 \rangle$ at $\lambda_{t/s}$=532 nm/1042 nm. $W_{MW}$ is the microwave transition rate approximated as $\Omega_R^2 T_2^*/2$, where $\Omega_R$ is the Rabi angular frequency and $T_2^*$ is the electronic spin dephasing time. The relevant parameters are listed below in TABLE 1:

TABLE 1

Physical Parameters

| Parameter | Value |
|---|---|
| $k_{31} = k_{42}$ | 66 s$^{-1}$ |
| $k_{35}$ | 7.9 s$^{-1}$ |
| $k_{45}$ | 53 s$^{-1}$ |
| $k_{61}$ | 1 s$^{-1}$ |
| $k_{62}$ | 0.7 s$^{-1}$ |
| $k_{38} = k_{48}$ | 41.8 MHz/mW |
| $k_{71} = k_{72}$ | 35.5 MHz/mW |
| $\Gamma$ | 1 ns$^{-1}$ |
| $\Gamma_{NV^0}$ | 53 s$^{-1}$ |
| $\sigma_t$ | 3 × 10$^{-21}$ m$^2$ |
| $\sigma_s$ | 3 × 10$^{-22}$ m$^2$ |
| $\sigma_{NV^0}$ | 6 × 10$^{-21}$ m$^2$ |

TABLE 1-continued

Physical Parameters

| Parameter | Value |
|---|---|
| $n_{NV}$ | 2 ppm |
| $T_2^*$ | 1 s |
| $T_2$ | 10 s |

The spin-dependent IR absorption, $|\alpha_{NV}(I_p,\Omega_R)|^2$, can be obtained from the net population of the ground singlet state calculated from the coupled rate equations given above. The calculations here are based on the properties of a 1-μm thick NV layer with a spin defect center density of 2 ppm. For a [100] diamond plane, all four orientations of NVs should have equal contributions for the given SLR-induced field profile.

FIG. 8A shows the net population of the ground singlet state, $n_{|6\rangle} - n_{|5\rangle}$, as a function of the pump beam intensity, $I_t$, for IR probe beam intensities, $I_s$, ranging from 0.01 mW/μm² (top traces) to 100 mW/μm² (bottom traces) with (solid traces) and without (dashed traces) a microwave field. Under steady state conditions (in the case of continuous wave (CW)-ODMR), FIG. 8A shows that the net population of the ground singlet state, $n_{|6\rangle} - n_{|5\rangle}$, weakly depends on the IR probe intensity until the absorption rate becomes comparable to the excited state decay rate. To account for stimulated emission, consider a net population (i.e., $n_{|6\rangle} - n_{|5\rangle}$). Because the lifetime of the ground state is approximately two orders of magnitude longer than that of the excited state, the singlet state transition has an exceptionally high saturation intensity, enabling each NV to absorb multiple photons per cycle. The resonant structures bring the system to this saturation level with an IR incident intensity that is reduced by a factor of about $\langle |E/E_0|^2 \rangle$. Similarly, the same PQSM structure can accommodate a Bragg mode resonant at $\lambda_t$=532 nm with a change in incidence angle with $\langle |E/E_0|^2 \rangle \approx 2$.

The SLR-RWA resonant field intensity enhancement also modifies the radiative decay rate by $\gamma_{rad} \to F_p\gamma_{rad} + \gamma_{quenching}$, where $F_p$ is the Purcell factor. However, the probability that absorbed IR photons will be re-emitted is negligible for at least two reasons. First, the singlet state transition shows a low intrinsic quantum efficiency, $\gamma_{rad}/\Gamma$, near 0.1%. Second, the quality factor of NVs' singlet state transition at room temperature is orders of magnitude smaller than that of the PQSM.

FIG. 8B shows the change in NV absorption with and without an applied 1\4 W field, $A_{NV}(I_p,\Omega_R) - A_{NV}(I_p,0)$, at IR probe beam intensities, $I_s$, ranging from 0.01 mW/μm² (top trace) to 100 mW/μm² (bottom trace). Under an applied microwave field, electronic spins in the excited $m_s=\pm 1$ states preferentially decay into the singlet states. This incurs an increase in spin-selective NV IR absorption (i.e., $|\alpha_{NV}(I_p,\Omega_R)|^2 > |\alpha_{NV}(I_p,0)|^2$). Per the Kramers-Kronig relations, NV absorption accompanies a spin-dependent phase shift, $\Delta\phi_{NV}(I_p,\Omega_R)$. The spin-dependent phase and amplitude modulations of the reflected IR probe field by the PQSM enable quantum sensing. These phase and amplitude changes of the signal allow for a phase-sensitive measurement. The phase can be measured using a phase-sensitive coherent homodyne detection, where a local oscillator interferes with the spin-dependent signal from the PQSM as described above. If the photon shot noise dominates, the SNR can be increased by biasing the interferometric readout with a controlled phase difference.

Optimizing Homodyne Detection

The SNR for homodyne and direct detection can be increased by biasing the local oscillator, e.g., to achieve unity spin contrast. Homodyne detection is particularly advantageous for fast imaging on focal plane arrays. Under confocal scanning, for example, a focal plane array could be integrated into an integrated photonics layer or programmable photonic unitaries; this would also enable basis transformations for compressive sampling and super-resolution imaging. Furthermore, coherent detection also enables quantum enhanced imaging schemes such as "interaction-free" imaging, imaging with undetected photons, or loss-tolerant quantum absorption measurements.

Figure 9C:
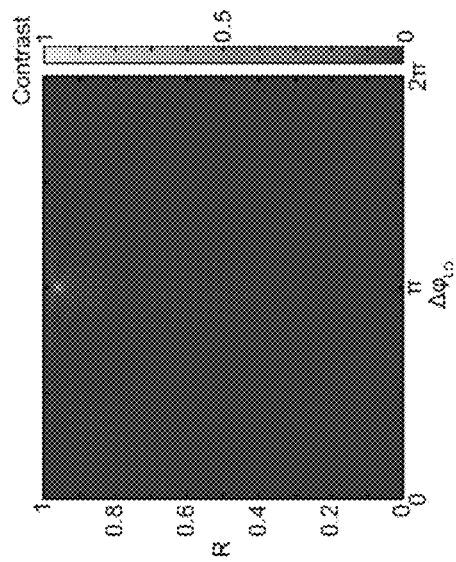
FIG. 9C is a contour plot of contrast as a function of R and $\Delta\phi_{LO}$ for given $I_s=1$ mW/m², $I_t=0.1$ mW/m², $\Delta t_{mea}=1$ µs, and $\alpha=1$.
Figure 9B:
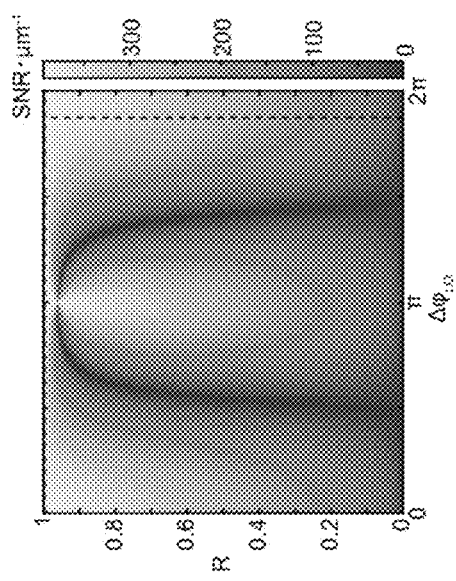
FIG. 9B is a contour plot of pixel-area-normalized SNR as a function of R and $\Delta\phi_{LO}$ for given $I_s=1$ mW/m², $I_t=0.1$ mW/m², $\Delta t_{mea}=1$ µs, and $\alpha=1$.
Figure 9A:
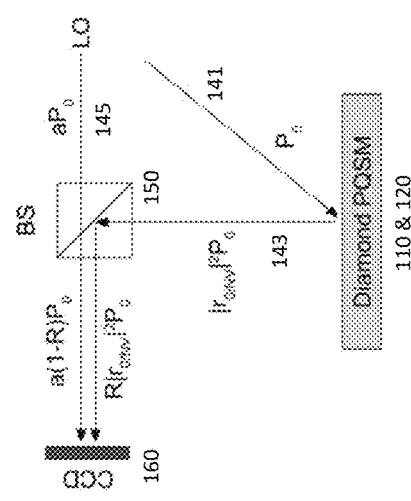
FIG. 9A illustrates homodyne detection setup of the reflected IR probe beam.

FIG. 9A illustrate homodyne detection of the reflected IR probe beam 143, where $P_0$ is the incident probe beam power at 1042 nm and is given by $I_s L^2$, where $L^2$ is the pixel area. The metasurface signal 143, $|r|^2 P_0$, and the local oscillator signal 145, $aP_0$, are the input signals to the beam splitter 150, which has a power splitting ratio of R. The CCD camera 160 detects an interfered signal given by:

$$\frac{I_{out}(I_t, \Omega_R, R, \Delta\phi_{LO})}{I_s} = (1-R) + R|r(I_t, \Omega_R)|^2 +$$
$$2\sqrt{(1-R)R}\,|r(I_t,\Omega_R)|\cos(\Delta\phi_{LO} + \Delta\phi_{NV}(I_t,\Omega_R)).$$

The optimal operating conditions for homodyne detection occur for combinations of R and $\Delta\phi_{LO}$ that maximize SNR/$\sqrt{L^2}$. These conditions can be found numerically for given $I_s$ and $I_t$.

FIG. 9B shows a contour plot of the area-normalized SNR as a function of $\Delta\phi_{LO}$ and R for given $I_s$, $I_t$, and $\Delta t_{mea}$. The maximum is found at the crossover of the two dotted lines. The phase-sensitive interferometric measurement allows unity contrast by biasing the local oscillator as shown in FIG. 9C.

Under the assumption of strong local oscillator (R→1), the SNR can be approximated as follows:

$$SNR_{homodyne} = C \times \frac{I(\Omega_R) - I(0)}{\sqrt{I(\Omega_R) + I(0)}}$$
$$\approx C \times \frac{2}{\sqrt{2}} \times (|r(I_t, 0)|\cos(\Delta\phi_{LO} + \Delta\phi_{NV}(I_t,0)) -$$
$$|r(I_t,\Omega_R)|\cos(\Delta\phi_{LO} + \Delta\phi_{NV}(I_t,\Omega_R)))$$

where $C = \sqrt{\Delta t_{mea} L^2/\hbar\omega_0}$ and $I(0/\Omega_R) = I_{out}(I_t, 0/\Omega_R, R, \Delta\phi_{LO})$. For comparison with direct detection, the SNR under the assumption of $|\alpha_{NV}|^2 \ll |\alpha_0|^2$ can be approximated as follows:

$$SNR_{direct} \approx C \times \frac{|r(I_t,0)|^2 - |r(I_t,\Omega_R)|^2}{\sqrt{2|\alpha_0|^2}}$$
$$\approx C \times \frac{2}{\sqrt{2}} \times (|\alpha_{NV}(\Omega_R)| - |\alpha_{NV}(0)|)$$

DC Sensitivity

The shot-noise-limited sensitivity of a CW-ODMR-based magnetometer per root area based on IR absorption measurement is given by:

$$\eta_{CW}^A = \frac{\hbar\Gamma_{MW}}{g\mu_B} \frac{\sqrt{\Delta t_{mea} L^2}}{SNR},$$

where g≈2.003 is the g-factor of of the electron of the NV center, $\mu_B$ is the Bohr magneton, and $\Gamma_{MW}$ is the magnetic-resonance linewidth which can be approximated as $\Gamma_{MS}=2/T_2^*$, assuming no power broadening from pump or microwaves. The sensitivity is normalized by an arbitrary pixel area, $L^2$, and is reported for a given an NV layer thickness of $d_{NV}=1$ m and an NV density of 2 ppm. The remaining experimental parameters are listed in Table 1. An alternative magnetometry method to CW-ODMR, such as pulsed ODMR or Ramsey sequences, can be exploited to achieve $T_2^*$-limited performance. It is useful to compare the photon-shot-noise-limited sensitivity with the spin-projection-noise-limited sensitivity of an ensemble magnetometer consisting of non-interacting spins.

$$\eta_{sp}^{A,ensemble} = \frac{\hbar}{g\mu_B \sqrt{n_{NV} d_{NV} \tau}},$$

where $\tau$ is the free precession time per measurement.

FIG. 10 is a plot of the area-normalized sensitivity as a function of $I_t$ with varying $I_s$ for the PQSM of FIG. 1A. It shows that this PQSM can achieve sub-nT Hz$^{-1/2}$ sensitivity per μm$^2$ sensing surface area (indicated by the dashed black line). The sensitivity improves with increasing green laser intensity until two-photon-mediated photo-ionization processes start to become considerable. With an IR intensity approaching 100 mW/ μm$^2$, the sensitivity becomes only a factor of about 1.45 away from the spin-projection-noise-limited sensitivity. For wide-field imaging applications, sub-nT Hz$^{-1/2}$ per μm$^2$ sensitivity can be maintained with reasonable power consumption of green and IR laser sources (e.g., 1 W of green laser light and 100 mW of IR laser light over 100 μm×100 μm sensing area). A better sensitivity can be achieved with an increase in the NV density without compromising the spin properties via realizing a higher NV conversion efficiency, for example (as the residual nitrogen impurities are typically dominant sources of limiting the coherence time). Additionally, the sensitivity can be further improved by implementing a decoupling sequence that is compatible with DC magnetometry to protect NV sensors from dephasing mechanisms and extend the $T_2^*$ up to 10 seconds.

AC Sensitivity

Sources of NV spin dephasing can be largely eliminated with coherent control techniques such as the Hahn echo sequence. With an added π-pulse halfway through the interrogation time, a net phase accumulated due to a static or slowly varying magnetic field cancels out, and the interrogation time can be extended to a value of ~$T_2$. Thus, the AC sensitivity can be improved by a factor of approximately $\sqrt{T_2^*/T_2}$ at the cost of a reduced bandwidth and insensitivity to magnetic field with an oscillating period longer than $T_2$. For a given NV density of ~2 ppm, $T_2$ is about an order of magnitude longer than $T_2^*$. The sensitivity per root area for an ensemble-based AC magnetometer is given by:

$$\eta_{a.c.}^A = \frac{\hbar \sigma_R e^{\tau/T_2}}{g\mu_B \sqrt{n_{NV} d_{NV} \tau}} \sqrt{1 + \frac{t_I + \Delta t_{mea}}{\tau}},$$

where $T_2$ is the characteristic dephasing time, $t_I$ is the initialization time, $\Delta t_{mea}$ is the readout time, and $\sigma_R$ is the readout fidelity.

FIG. 11A is a plot of the population of the ground singlet state with (solid) and without (dotted) an applied microwave field as a function of readout time for a given $I_s=1$ mW/m². Each trace represents a different pump beam intensity $I_t$, with values ranging from 0.05 mW/µm² (bottom traces) to 0.35 mW/µm² (top traces). FIG. 11B shows the readout fidelity versus pump laser intensity $I_t$ for IR probe beam intensities ranging from 0.01 mW/µm² (bottom trace) to 100 mW/µm² (top trace).

The time-dependent population evolution shown in FIG. 11A is determined by solving the rate equations as a function of time. The system achieves maximum spin contrast approximately within the first second of readout and finally loses polarization with increasing readout time, limited by the lifetime of the ground singlet state. A readout time that maximizes the time-integrated signal can be calculated for a given $I_t$ and a given $I_s$. The power-dependent optimal readout time is found based on the balance between maintaining a spin contrast and preventing a large measurement overhead time.

An additional shot noise introduced by the optical readout is quantified with the parameter $\sigma_R$, which is equivalent to an inverse of readout fidelity:

$$\sigma_R = \sqrt{1 + \frac{2(a+b)}{(a-b)^2}},$$

where a and b are the average numbers of photons detected from the $m_s=0$ and $m_s=\pm 1$ states per spin per measurement, respectively. As shown in FIG. 10B, the PQSM achieves near unity readout fidelity per shot.

FIG. 12 is a log-log plot of the AC sensitivity down to about 10 pT Hz$^{-1/2}$ per square micron of sensing surface area. The traces represent probe intensities ranging from 0.01 mW/µm² to 100 mW/µm². At the scale of FIG. 12, the traces are nearly coincident and start at a $\Delta t_{mea}$ of roughly 40,000 ns up at pump intensities of about $10^{-4}$ mW/µm². $\Delta t_{mea}$ decreases to roughly 200 ns at pump intensities of about 1 mW/µm² and higher.

SNR of the PQSM

The intrinsic rate of absorption can be written in terms of the intrinsic absorption cross section of the singlet state transition, $\sigma_s$, as:

$$\Gamma_0 = \frac{\sigma_s I_s}{\hbar \omega_0}$$

The PQSM disclosed here enhances the rate of absorption of a spin defect center (e.g., an NV) at the position (x, y, z) by a factor of $|E(x, y)/E_0|^2$, where $E_0$ is the electric field in a homogeneous environment and $E(x, y)$ is the electric field induced by the LSP-RWA hybrid mode of the PQSM, invariant in z-direction. Define $|\alpha_{NV}(\Omega_R)|^2$ as NV absorption as follows:

$$|\alpha_{NV}(\Omega_R)|^2 = \frac{\sigma_s N_{NV}(I_t, \Omega_R) \int_0^{d_{NV}} \int_{-p/2}^{p/2} \left|\frac{E(x,y)}{E_0}\right|^2 dxdy}{L^2 \int_0^{d_{NV}} \int_{-p/2}^{p/2} dxdy}$$

$$= \frac{\sigma_s(n_{|6\rangle} - n_{|5\rangle}) \int_0^{d_{NV}} \int_{-p/2}^{p/2} \left|\frac{E(x,y)}{E_0}\right|^2 dxdy}{p}$$

where $N_{NV}(I_t, \Omega_R)$ no is the total net NV population in the ground singlet state for a given $V_{pixel}=d_{NV}L^2$, which is given by $(n_{|6\rangle} - n_{|5\rangle})V_{pixel}$. The net population of the singlet ground state (i.e., $n_{|6\rangle} - n_{|5\rangle}$) is used to account for stimulated emission. The SNR is therefore $$SNR = \frac{|N_0 - N_1|}{\sqrt{N_0 + N_1}}$$

$$= \sqrt{\frac{I_s L^2 \Delta t_{mea}}{\hbar \omega_0}} \frac{|\alpha_0 - \alpha_{NV}(0)|^2 - |\alpha_0 - \alpha_{NV}(\Omega_R)|^2}{\sqrt{|\alpha_0 - \alpha_{NV}(0)|^2 + |\alpha_0 - \alpha_{NV}(\Omega_R)|^2}},$$

where $$N_{0/1} = \frac{I_s L^2 \Delta t_{mea}}{\hbar \omega_0} |\alpha_0 - \alpha_{NV}(0/\Omega_R)|^2 \text{ and } |\alpha_0|^2$$

is the intrinsic reflection of the metasurface without NV contributions. For $|\alpha_0|^2 \gg |\alpha_{NV}(\Omega_R)|^2$, the SNR is proportional to $|\alpha_{NV}(\Omega_R)| - |\alpha_{NV}(0)|$.

$$SNR \approx \frac{2}{\sqrt{2}} \sqrt{\frac{I_s L^2 \Delta t_{mea}}{\hbar \omega_0}} (|\alpha_{NV}(\Omega_R)| - |\alpha_{NV}(0)|)$$

$$= \frac{2}{\sqrt{2}} \sqrt{\frac{I_s L^2 \Delta t_{mea} \sigma_s}{\hbar \omega_0 p}} \int_0^{d_{NV}} \int_{-p/2}^{p/2} \left|\frac{E(x,y)}{E_0}\right|^2 dxdy \times$$

$$\left(\sqrt{(n_{|6\rangle} - n_{|5\rangle})_{\Omega_R}} - \sqrt{(n_{|6\rangle} - n_{|5\rangle})_0}\right)$$

The performance of an ensemble-based sensor scales with $\sqrt{\langle |E/E_0|^2 \rangle V_{pixel}}$.

FIG. 13 is a plot of the normalized, spatially averaged electric field (left axis) and figure of merit (right axis) versus sensing layer thickness. It shows that the electric field is highly concentrated near the metal surface as shown in the plotted $\langle |E/E_0|^2 \rangle$ and that the figure of merit, $\sqrt{\langle |E/E_0|^2 \rangle V_{pixel}}$, increases with $d_{NV}$ (or $V_{pixel}$ for a given pixel size of $L^2$).

Optimal Readout Condition for Pulsed Measurements

As shown in FIG. 11A, in pulsed measurements, the system achieves maximum spin contrast approximately within the first second of readout and finally loses polarization with increasing readout time, limited by the lifetime of the ground singlet state.

There exists an optimal readout time that gives the maximum time-averaged signal-to-noise ratio. FIG. 14 shows the optimal readout time, $\Delta t_{mea}$, as a function of excitation intensities. The readout contrast diminishes more quickly with a higher green laser intensity, $I_r$, as the photoionization process starts to become significant. At high $I_r$, the diminishing contrast caps the optimal readout time. At small $I_r$, the contrast diminishes more slowly; however, a readout time that is much longer than the spin interrogation time introduces a large measurement overhead time, which limits the sensitivity of the PQSM. Thus, at small $I_r$, the measurement overhead time limits the optimal readout time. For a given $I_t$ and a given $I_s$, it is possible to find the readout time, $\Delta t_{mea}$, that maximizes the product of the time-averaged contrast and $\sqrt{\tau/(\tau+\Delta t_{mea})}$, where $\tau$ is the spin interrogation time.

Conclusion

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of" "only one of" or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A system comprising:
a solid-state host comprising a sensing layer containing spin defect centers having absorption resonances that change in response to at least one of an electric field, a magnetic field, a temperature, a stress, or a strain;

an infrared light source, in optical communication with the spin defect centers, to illuminate the spin defect centers with an infrared optical field;

a periodic structure, disposed on or embedded in the sensing layer, to enhance the infrared optical field in the sensing layer; and a detector, in optical communication with the solid-state host via the periodic structure, to sense absorption of the infrared optical field by at least some of the spin defect centers, wherein the periodic structure comprises a metallodielectric grating with a spacing of a wavelength of the infrared optical field divided by a refractive index of the solid-state host.

2. The system of claim 1, wherein the infrared light source is configured to emit the infrared optical field at a wavelength of 1042 nm.

3. The system of claim 1, wherein the periodic structure is embedded in the sensing layer.

4. The system of claim 1, wherein the periodic structure is disposed on the sensing layer.

5. The system of claim 1, wherein the periodic structure has a quality factor of about 100 to about 10,000.

6. The system of claim 1, wherein the metallodielectric grating is configured to apply a bias magnetic field to the sensing layer.

7. The system of claim 1, wherein the absorption by the spin defect centers varies in response to the magnetic field and the system is configured to detect variations in the magnetic field with a sensitivity of below 1 $nT/Hz^{1/2}$ per $\mu m^2$.

8. The system of claim 1, further comprising:
a pump light source, in optical communication with the solid-state host, to illuminate the spin defect centers with a pump beam that excites the spin defect centers to an excited state.

9. The system of claim 8, wherein the periodic structure is patterned to concentrate the pump beam in the sensing layer.

10. A method of detecting an environmental parameter experienced by spin defect centers in a sensing layer formed in a solid-state host, the method comprising:
illuminating a periodic structure embedded in or disposed on the sensing layer with an infrared probe beam, the periodic structure enhancing absorption of the infrared probe beam by the spin defect centers in the sensing layer; and detecting a change in the absorption of the infrared probe beam by the spin defect centers caused by at least one of an electric field, a magnetic field, a temperature, a stress, or a strain, wherein the periodic structure comprises a metallodielectric grating with a spacing of a wavelength of the infrared probe beam divided by a refractive index of the solid-state host and further comprising:

applying a bias magnetic field to the spin defect centers with the metallodielectric grating.

11. The method of claim 10, wherein detecting the absorption of the infrared probe beam comprises detecting a portion of the infrared probe beam diffracted from the periodic structure at a Bragg angle of the periodic structure.

12. The method of claim 11, wherein detecting the absorption of the infrared probe beam comprises performing a homodyne measurement of the portion of the infrared probe beam diffracted from the periodic structure.

13. The method of claim 10, wherein the absorption by the spin defect centers varies in response to the magnetic field and further comprising:
detecting variations in the magnetic field with a sensitivity of below 1 $nT/Hz^{1/2}$ per $\mu m^2$ based on the change in the absorption of the infrared probe beam by the spin defect centers.

14. The method of claim 10, further comprising:
exciting the spin defect centers in the sensing layer with visible light.

15. A system for sensing a magnetic field, the system comprising:
a solid-state host;
spin defect centers disposed within one millimeter of a surface of the solid-state host and having absorption resonances that shift in response to the magnetic field;
an infrared light source, in optical communication with the spin defect centers, to illuminate the spin defect centers with an infrared optical radiation;
a metallodielectric grating, embedded in the surface of the solid-state host and having a period based on a wavelength of the infrared optical radiation and a refractive index of the solid-state host at the wavelength of the infrared optical radiation, to apply a bias magnetic field to the spin defect centers and to enhance absorption of the infrared optical radiation by the spin defect centers; and
a detector, in optical communication with the spin defect centers via the metallodielectric grating, to sense the absorption of the infrared optical radiation by the spin defect centers.

16. The system of claim 15, wherein the metallodielectric grating is configured to support a hybrid plasmonic surface lattice resonance-Rayleigh-Wood anomaly mode that concentrates the infrared optical radiation within one millimeter of the surface of the solid-state host.

17. The system of claim 15, wherein the metallodielectric grating has a quality factor of 100 to 1000.

18. The system of claim 15, wherein the detector is configured to acquire a phase-sensitive homodyne image of the spin defect centers.

19. A method of detecting an environmental parameter experienced by spin center defects in a sensing layer formed in a solid-state host, the method comprising:
illuminating a periodic structure embedded in or disposed on the sensing layer with an infrared probe beam, the periodic structure enhancing absorption of the infrared probe beam by the spin defect centers in the sensing layer; and detecting a change in the absorption of the infrared probe beam by the spin defect centers caused by at least one of an electric field, a magnetic field, a temperature, a stress, or a strain, wherein detecting the change in absorption of the infrared probe beam comprises detecting a portion of the infrared probe beam diffracted from the periodic structure at a Bragg angle of the periodic structure and performing a homodyne measurement of the portion of the infrared probe beam diffracted from the periodic structure.

* * * * *